(12) United States Patent
Kondo et al.

(10) Patent No.: US 9,349,927 B2
(45) Date of Patent: May 24, 2016

(54) ENCAPSULATING SHEET AND OPTICAL SEMICONDUCTOR ELEMENT DEVICE

(71) Applicant: NITTO DENKO CORPORATION, Ibaraki-shi, Osaka (JP)

(72) Inventors: Takashi Kondo, Ibaraki (JP); Hiroki Kono, Ibaraki (JP); Yuki Ebe, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 13/650,761

(22) Filed: Oct. 12, 2012

(65) Prior Publication Data

US 2013/0092973 A1 Apr. 18, 2013

(30) Foreign Application Priority Data

Oct. 18, 2011 (JP) ................. 2011-228921
Dec. 28, 2011 (JP) ................. 2011-289901

(51) Int. Cl.

| | | |
|---|---|---|
| H01L 23/28 | (2006.01) | |
| H01L 33/56 | (2010.01) | |
| C08L 83/04 | (2006.01) | |
| C08G 77/04 | (2006.01) | |
| C08G 77/12 | (2006.01) | |
| C08G 77/14 | (2006.01) | |

(Continued)

(52) U.S. Cl.
CPC ............ *H01L 33/56* (2013.01); *C08L 83/04* (2013.01); *C08G 77/045* (2013.01); *C08G 77/12* (2013.01); *C08G 77/14* (2013.01); *C08G 77/16* (2013.01); *C08G 77/20* (2013.01); *C08K 5/5425* (2013.01); *C08K 5/5435* (2013.01); *C08K 5/56* (2013.01); *H01L 33/501* (2013.01); *H01L 33/54* (2013.01); *H01L 2933/005* (2013.01); *H01L 2933/0041* (2013.01)

(58) Field of Classification Search
CPC .......... H01L 23/28; H01L 51/54; H01L 23/30
USPC ............ 257/98, E21.502, 787, 788, 793, 799, 257/667, E33.061; 438/26, 780
See application file for complete search history.

(56) References Cited

U.S. PATENT DOCUMENTS 4,933,744 A * 6/1990 Segawa et al. ................. 257/795
5,123,826 A * 6/1992 Baird .......................... 425/129.1

(Continued)

FOREIGN PATENT DOCUMENTS

| CN | 101300687 | 11/2008 |
|---|---|---|
| JP | 61-160981 | 7/1986 |

(Continued)

OTHER PUBLICATIONS

Extended European Search Report dated Jan. 15, 2014, issued by the European Patent Office in corresponding European Application No. 12188649.3.

(Continued)

*Primary Examiner* — David Vu
*Assistant Examiner* — Mouloucoulaye Inoussa
(74) *Attorney, Agent, or Firm* — Sughrue Mion, PLLC

(57) ABSTRACT

An encapsulating sheet is formed from an encapsulating resin composition which contains an encapsulating resin and silicone microparticles, and the mixing ratio of the silicone microparticles with respect to the encapsulating resin composition is 20 to 50 mass %.

8 Claims, 2 Drawing Sheets

(51) Int. Cl.

| | |
|---|---|
| C08G 77/16 | (2006.01) |
| C08G 77/20 | (2006.01) |
| C08K 5/5425 | (2006.01) |
| C08K 5/5435 | (2006.01) |
| C08K 5/56 | (2006.01) |
| H01L 33/50 | (2010.01) |
| H01L 33/54 | (2010.01) |

(56) References Cited

U.S. PATENT DOCUMENTS

| | | | |
|---|---|---|---|
| 5,126,826 A * | 6/1992 | Kauchi et al. | 257/461 |
| 2005/0220414 A1 | 10/2005 | Harada et al. | |
| 2006/0118973 A1 | 6/2006 | Harada et al. | |
| 2010/0033810 A1 | 2/2010 | Haida et al. | |
| 2010/0225010 A1 | 9/2010 | Katayama | |
| 2011/0031516 A1 * | 2/2011 | Basin et al. | 257/98 |
| 2011/0079816 A1 | 4/2011 | Fujioka et al. | |
| 2011/0147722 A1 * | 6/2011 | Hawker et al. | 257/40 |
| 2011/0248312 A1 | 10/2011 | Katayama | |
| 2012/0319153 A1 * | 12/2012 | Matsuda et al. | 257/98 |

FOREIGN PATENT DOCUMENTS

| | | |
|---|---|---|
| JP | 2005-294733 A | 10/2005 |
| JP | 2006-137797 A | 6/2006 |
| JP | 2006-140362 A | 6/2006 |
| JP | 2006-321832 | 11/2006 |
| JP | 2008-181079 A | 8/2008 |
| JP | 2008-230114 | 10/2008 |
| JP | 2009-173789 A | 8/2009 |
| JP | 2009-260194 | 11/2009 |
| JP | 2010-159411 A | 7/2010 |
| JP | 2010-202801 A | 9/2010 |
| JP | 2010-265436 A | 11/2010 |
| JP | 2010-265437 A | 11/2010 |
| JP | 2010-285593 | 12/2010 |
| JP | 2011-003870 | 1/2011 |
| JP | 2011-042732 A | 3/2011 |
| JP | 2011-082340 A | 4/2011 |
| JP | 2011-219597 A | 11/2011 |
| JP | 2011-228525 A | 11/2011 |
| WO | 2007/049187 | 3/2007 |
| WO | 2007/049187 A1 | 5/2007 |

OTHER PUBLICATIONS

Communication dated Dec. 8, 2014, issued by the European Patent Office in counterpart European application No. 12 188 649.3.
Notification of Reasons for Refusal dated Apr. 28, 2015, issued by the Japan Patent Office in corresponding application No. 2011-288200.
Notification of Reasons for Refusal dated Jul. 21, 2015, issued from the Japanese Patent Office in corresponding JP 2011-289901.
Notification of Reasons for Refusal dated Jun. 19, 2015, issued by the Japanese Patent Office in corresponding JP Application No. 2011-228921.
Notification of Reasons for Refusal dispatched Dec. 8, 2015 issued by the Japanese Patent Office in corresponding JP 2011-289901.
Notification of First Office Action issued Feb. 22, 2016 by the State Intellectual Property Office of P. R. China in corresponding CN 201210397782.8.

* cited by examiner

ENCAPSULATING SHEET AND OPTICAL SEMICONDUCTOR ELEMENT DEVICE

CROSS-REFERENCE TO RELATED APPLICATION

The present application claims priority from Japanese Patent Applications No. 2011-228921 filed on Oct. 18, 2011 and No. 2011-289901 filed on Dec. 28, 2011, the contents of which are hereby incorporated by reference into this application.

BACKGROUND OF THE INVENTION

1. Field of the Invention

The present invention relates to an encapsulating sheet and an optical semiconductor element device, to be specific, to an optical semiconductor element device used for an optical application and an encapsulating sheet used therein.

2. Description of Related Art

Conventionally, a light emitting device capable of emitting high-energy light has been known.

The light emitting device includes, for example, an optical semiconductor, a board mounted with the optical semiconductor, and an encapsulating material formed on the board so as to encapsulate the optical semiconductor. The optical semiconductor emits light and the emitted light transmits through the encapsulating material, so that the light emitting device emits light.

As the encapsulating material of the light emitting device, for example, an optical semiconductor encapsulating material in a sheet shape which contains a silicone resin and silica particles has been proposed (ref: for example, Japanese Unexamined Patent Publication No. 2011-228525).

SUMMARY OF THE INVENTION

In the light emitting device, the improvement in the extraction efficiency of the light from the optical semiconductor has been further desired.

However, in the optical semiconductor encapsulating material in a sheet shape described in Japanese Unexamined Patent Publication No. 2011-228525, the light transmittance thereof is insufficient to satisfy the above-described requirement. Therefore, in the light emitting device provided with the optical semiconductor which is encapsulated by the optical semiconductor encapsulating material in a sheet shape described in Japanese Unexamined Patent Publication No. 2011-228525, by an additive which contains silica particles and the like in the optical semiconductor encapsulating material in a sheet shape, a part of the light emitted from the optical semiconductor is reflected at the lower side to be absorbed in a board, so that the brightness of the light emitting device is reduced (a brightness loss occurs).

It is an object of the present invention to provide an encapsulating sheet which is capable of suppressing a brightness loss and has an excellent reliability and an optical semiconductor element device which is provided with an optical semiconductor element encapsulated by the encapsulating sheet.

An encapsulating sheet of the present invention is formed from an encapsulating resin composition which contains an encapsulating resin and silicone microparticles, and the mixing ratio of the silicone microparticles with respect to the encapsulating resin composition is 20 to 50 mass %.

In the encapsulating sheet of the present invention, it is preferable that the encapsulating resin is made from a silicone resin composition.

In the encapsulating sheet of the present invention, it is preferable that the encapsulating resin composition further contains a phosphor.

An optical semiconductor element device of the present invention includes an optical semiconductor element and an encapsulating layer which is formed from the above-described encapsulating sheet and encapsulates the optical semiconductor element.

In the encapsulating sheet of the present invention, the encapsulating resin composition contains the silicone microparticles, so that the light transmission characteristics thereof is excellent, compared to the case where another additive is contained.

Therefore, in the optical semiconductor element device of the present invention provided with the optical semiconductor element which is encapsulated by the encapsulating sheet of the present invention, the brightness loss in the encapsulating sheet can be sufficiently suppressed.

In the encapsulating sheet of the present invention, the encapsulating resin composition contains the silicone microparticles at a specific proportion, so that in the optical semiconductor element device of the present invention, a bleeding can be prevented and a damage of the optical semiconductor element can be also prevented.

As a result, the optical semiconductor element device of the present invention has an excellent reliability, while having an excellent extraction efficiency of the light from the optical semiconductor.

DETAILED DESCRIPTION OF THE INVENTION

Figure 1A:
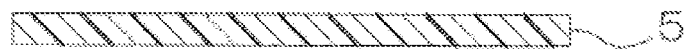
FIGS. 1(a) and 1(b) show process drawings for illustrating the steps of producing one embodiment of an encapsulating sheet of the present invention:
  1(a) illustrating a step of preparing a release sheet and
  1(b) illustrating a step of laminating an encapsulating resin layer.

An encapsulating sheet of the present invention is formed from an encapsulating resin composition which contains an encapsulating resin and silicone microparticles.

To be specific, the encapsulating sheet of the present invention includes an encapsulating resin layer formed from the encapsulating resin composition into a generally sheet shape.

The encapsulating resin includes a known transparent resin used in encapsulating an optical semiconductor element. Examples of the transparent resin include a thermosetting resin such as a silicone resin, an epoxy resin, and a urethane resin and a thermoplastic resin such as an acrylic resin, a styrene resin, a polycarbonate resin, and a polyolefin resin.

The encapsulating resins can be used alone or in combination.

The light transmittance of the encapsulating resin which is formed into a sheet shape having a thickness of 500 μm with respect to the visible light in the wavelength of 400 nm to 700 nm is, for example, 80% or more, preferably 90% or more, or more preferably 95% or more, and is, for example, 100% or less.

When the light transmittance of the encapsulating resin which is formed into a sheet shape having a thickness of 500 μm with respect to the visible light in the wavelength of 400 nm to 700 nm is below the above-described lower limit, a brightness loss by the encapsulating sheet may not be sufficiently suppressed.

The light transmittance of the encapsulating resin is measured with a spectrophotometer.

The haze value of the encapsulating resin which is formed into a sheet shape having a thickness of 500 μm is, for example, 20 or less, or preferably 10 or less, and exceeds, for example, 0.

When the haze value of the encapsulating resin exceeds the above-described upper limit, a brightness loss by the encapsulating sheet may not be sufficiently suppressed.

The haze value of the encapsulating resin is measured with a haze meter.

The refractive index of the encapsulating resin (the refractive index of the encapsulating resin after curing when the encapsulating resin is a thermosetting resin) is, for example, 1.39 to 1.43, or preferably 1.40 to 1.42.

Of the encapsulating resins, preferably, a thermosetting resin is used, or more preferably, in view of durability, heat resistance, and light resistance, a silicone resin is used.

The silicone resin is made of a silicone resin composition. Examples of the silicone resin composition include a condensation/addition reaction curable type silicone resin composition, a modified silicone resin composition containing a hetero atom, an addition reaction curable type silicone resin composition, a silicone resin composition containing an inorganic oxide, and a thermoplastic/thermosetting silicone resin composition.

Of the silicone resin compositions, in view of flexibility of the encapsulating resin layer before curing and strength thereof after curing, preferably, a condensation/addition reaction curable type silicone resin composition is used.

The condensation/addition reaction curable type silicone resin composition is a silicone resin composition which can undergo a condensation reaction and an addition reaction (to be specific, a hydrosilylation reaction). To be more specific, the condensation/addition reaction curable type silicone resin composition is a silicone resin composition which can be brought into a semi-cured state by undergoing the condensation reaction by heating and then, be brought into a cured (completely cured) state by undergoing the addition reaction by further heating.

An example of the condensation reaction includes a silanol condensation reaction. Examples of the addition reaction include an epoxy ring-opening reaction and the hydrosilylation reaction.

The condensation/addition reaction curable type silicone resin composition contains, for example, a polysiloxane containing silanol groups at both ends, a silicon compound containing an ethylenically unsaturated hydrocarbon group (hereinafter, defined as an ethylenic silicon compound), a silicon compound containing an epoxy group, and an organohydrogensiloxane.

The polysiloxane containing silanol groups at both ends, the ethylenic silicon compound, and the silicon compound containing an epoxy group are condensation materials (materials subjected to the condensation reaction). The ethylenic silicon compound and the organohydrogensiloxane are addition materials (materials subjected to the addition reaction).

The polysiloxane containing silanol groups at both ends is an organosiloxane which contains silanol groups (SiOH groups) at both ends of a molecule and to be specific, is represented by the following general formula (1).

General Formula (1):

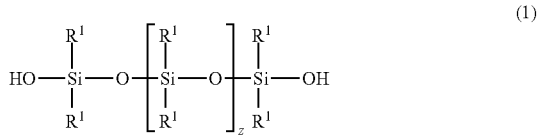

(where, in general formula (1), $R^1$ represents a monovalent hydrocarbon group selected from a saturated hydrocarbon group and an aromatic hydrocarbon group. "z" represents an integer of 1 or more.)

In the above-described general formula (1), in the monovalent hydrocarbon group represented by $R^1$, examples of the saturated hydrocarbon group include a straight chain or branched chain alkyl group having 1 to 6 carbon atoms (such as a methyl group, an ethyl group, a propyl group, an isopropyl group, a butyl group, an isobutyl group, a pentyl group, and a hexyl group) and a cycloalkyl group having 3 to 6 carbon atoms (such as a cyclopentyl group and a cyclohexyl group).

In the above-described general formula (1), in the monovalent hydrocarbon group represented by $R^1$, an example of the aromatic hydrocarbon group includes an aryl group having 6 to 10 carbon atoms (such as a phenyl group and a naphthyl group).

In the above-described general formula (1), $R^1$s may be the same or different from each other. Preferably, $R^1$s are the same.

As the monovalent hydrocarbon group, preferably, an alkyl group having 1 to 6 carbon atoms and an aryl group having 6 to 10 carbon atoms are used, or more preferably, in view of transparency, thermal stability, and light resistance, a methyl group is used.

In the above-described general formula (1), "z" is preferably, in view of stability and/or handling ability, an integer of 1 to 10000, or more preferably an integer of 1 to 1000.

"z" in the above-described general formula (1) is calculated as an average value.

To be specific, examples of the polysiloxane containing silanol groups at both ends include a polydimethylsiloxane containing silanol groups at both ends, a polymethylphenylsiloxane containing silanol groups at both ends, and a polydiphenylsiloxane containing silanol groups at both ends.

The polysiloxanes containing silanol groups at both ends can be used alone or in combination.

Of the polysiloxanes containing silanol groups at both ends, preferably, a polydimethylsiloxane containing silanol groups at both ends is used.

A commercially available product can be used as the polysiloxane containing silanol groups at both ends. A polysiloxane containing silanol groups at both ends synthesized in accordance with a known method can be also used.

The number average molecular weight of the polysiloxane containing silanol groups at both ends is, for example, in view of stability and/or handling ability, 100 to 1000000, or preferably 200 to 100000. The number average molecular weight is calculated by conversion based on standard polystyrene with a gel permeation chromatography. The number average molecular weight of materials, other than the polysiloxane containing silanol groups at both ends, to be described later, is also calculated in the same manner as described above.

The silanol group equivalent in the polysiloxane containing silanol groups at both ends is, for example, 0.002 to 25 mmol/g, or preferably 0.02 to 25 mmol/g.

The mixing ratio of the polysiloxane containing silanol groups at both ends with respect to 100 parts by mass of the condensation material is, for example, 1 to 99.99 parts by mass, preferably 50 to 99.9 parts by mass, or more preferably 80 to 99.5 parts by mass.

The ethylenic silicon compound is a silane compound having both an ethylenically unsaturated hydrocarbon group and a leaving group in a silanol condensation reaction and to be specific, is represented by the following general formula (2).

General Formula(2):

$$R^2-Si(X^1)_3 \quad (2)$$

(where, in general formula (2), $R^2$ represents a monovalent ethylenically unsaturated hydrocarbon group. $X^1$ represents a halogen atom, an alkoxy group, a phenoxy group, or an acetoxy group. $X^1$s may be the same or different from each other.)

In the above-described general formula (2), examples of the ethylenically unsaturated hydrocarbon group represented by $R^2$ include a substituted or unsubstituted ethylenically unsaturated hydrocarbon group. Examples thereof include an alkenyl group and a cycloalkenyl group.

An example of the alkenyl group includes an alkenyl group having 2 to 10 carbon atoms such as a vinyl group, an allyl group, a propenyl group, a butenyl group, a pentenyl group, a hexenyl group, a heptenyl group, and an octenyl group.

An example of the cycloalkenyl group includes a cycloalkenyl group having 3 to 10 carbon atoms such as a cyclohexenyl group and a norbornenyl group.

As the ethylenically unsaturated hydrocarbon group, in view of reactivity with a hydrosilyl group, preferably, an alkenyl group is used, more preferably, an alkenyl group having 2 to 5 carbon atoms is used, or particularly preferably, a vinyl group is used.

$X^1$ in the above-described general formula (2) is a leaving group in the silanol condensation reaction. $SiX^1$ group in the above-described general formula (2) is a reactive functional group in the silanol condensation reaction.

In the above-described general formula (2), examples of the halogen atom represented by $X^1$ include bromine, chlorine, fluorine, and iodine.

In the above-described general formula (2), examples of the alkoxy group represented by $X^1$ include an alkoxy group containing a straight chain or branched chain alkyl group having 1 to 6 carbon atoms (such as a methoxy group, an ethoxy group, a propoxy group, an isopropoxy group, a butoxy group, an isobutoxy group, a pentyloxy group, and a hexyloxy group) and an alkoxy group containing a cycloalkyl group having 3 to 6 carbon atoms (such as a cyclopentyloxy group and a cyclohexyloxy group).

In the above-described general formula (2), $X^1$s may be the same or different from each other. Preferably, $X^1$s are the same.

Of the $X^1$s in the above-described general formula (2), preferably, an alkoxy group is used, or more preferably, a methoxy group is used.

Examples of the ethylenic silicon compound include a trialkoxysilane containing an ethylenically unsaturated hydrocarbon group, a trihalogenated silane containing an ethylenically unsaturated hydrocarbon group, a triphenoxysilane containing an ethylenically unsaturated hydrocarbon group, and a triacetoxysilane containing an ethylenically unsaturated hydrocarbon group.

The ethylenic silicon compounds can be used alone or in combination.

Of the ethylenic silicon compounds, preferably, a trialkoxysilane containing an ethylenically unsaturated hydrocarbon group is used.

To be specific, examples of the trialkoxysilane containing an ethylenically unsaturated hydrocarbon group include vinyltrialkoxysilane such as vinyltrimethoxysilane, vinyltriethoxysilane, and vinyltripropoxysilane; allyltrimethoxysilane; propenyltrimethoxysilane; butenyltrimethoxysilane; and cyclohexenyltrimethoxysilane.

Of the trialkoxysilanes containing an ethylenically unsaturated hydrocarbon group, preferably, vinyltrialkoxysilane is used, or more preferably, vinyltrimethoxysilane is used.

The mixing ratio of the ethylenic silicon compound with respect to 100 parts by mass of the condensation material is, for example, 0.01 to 90 parts by mass, preferably 0.01 to 50 parts by mass, or more preferably 0.01 to 10 parts by mass.

A commercially available product can be used as the ethylenic silicon compound. An ethylenic silicon compound synthesized in accordance with a known method can be also used.

The silicon compound containing an epoxy group is a silane compound having both an epoxy group and a leaving group in the silanol condensation reaction and to be specific, is represented by the following general formula (3).

General Formula(3):

$$R^3-Si(X^2)_3 \quad (3)$$

(where, in general formula (3), $R^3$ represents a group having an epoxy structure. $X^2$ represents a halogen atom, an alkoxy group, a phenoxy group, or an acetoxy group. $X^2$s may be the same or different from each other.)

In the above-described general formula (3), examples of the group having an epoxy structure represented by $R^3$ include an epoxy group, a glycidyl ether group, and an epoxycycloalkyl group such as an epoxycyclohexyl group.

Of the groups having an epoxy structure, preferably, a glycidyl ether group is used. To be specific, the glycidyl ether group is a glycidoxyalkyl group represented by the following general formula (4).

General Formula (4):

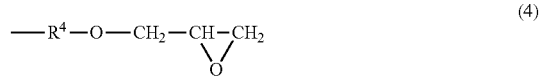

$$-R^4-O-CH_2-CH\underset{O}{\overset{}{-}}CH_2 \quad (4)$$

(where, in general formula (4), $R^4$ represents a divalent hydrocarbon group selected from a saturated hydrocarbon group and an aromatic hydrocarbon group.)

In the above-described general formula (4), in the divalent hydrocarbon group represented by $R^4$, examples of the saturated hydrocarbon group include an alkylene group having 1 to 6 carbon atoms (such as a methylene group, an ethylene group, a propylene group, and a butylene group) and a cycloalkylene group having 3 to 8 carbon atoms (such as a cyclopentylene group and a cyclohexylene group).

In the above-described general formula (4), in the divalent hydrocarbon group represented by $R^4$, an example of the aromatic hydrocarbon group includes an arylene group having 6 to 10 carbon atoms (such as a phenylene group and a naphthylene group).

As the divalent hydrocarbon group, preferably, an alkylene group having 1 to 6 carbon atoms is used, or more preferably, a propylene group is used.

To be specific, examples of the glycidyl ether group include a glycidoxymethyl group, a glycidoxyethyl group, a glycidoxypropyl group, a glycidoxycyclohexyl group, and a glycidoxyphenyl group.

Of the glycidyl ether groups, preferably, a glycidoxypropyl group is used.

$X^2$ in the above-described general formula (3) is a leaving group in the silanol condensation reaction. $SiX^2$ group in the above-described general formula (3) is a reactive functional group in the silanol condensation reaction.

In the above-described general formula (3), an example of the halogen atom represented by $X^2$ includes the same halogen atom as that represented by $X^1$ in the above-described general formula (2).

In the above-described general formula (3), an example of the alkoxy group represented by $X^2$ includes the same alkoxy group as that represented by $X^1$ in the above-described general formula (2).

In the above-described general formula (3), $X^2$s may be the same or different from each other. Preferably, $X^2$s are the same.

As $X^2$ in the above-described general formula (3), preferably, an alkoxy group is used, or more preferably, a methoxy group is used.

Examples of the silicon compound containing an epoxy group include a trialkoxysilane containing an epoxy group, a trihalogenated silane containing an epoxy group, a triphenoxysilane containing an epoxy group, and a triacetoxysilane containing an epoxy group.

The silicon compounds containing an epoxy group can be used alone or in combination.

Of the ethylenic silicon compounds, preferably, a trialkoxysilane containing an epoxy group is used.

To be specific, examples of the trialkoxysilane containing an epoxy group include glycidoxyalkyltrimethoxysilane such as glycidoxymethyltrimethoxysilane, (2-glycidoxyethyl)trimethoxysilane, and (3-glycidoxypropyl)trimethoxysilane; (3-glycidoxypropyl)triethoxysilane; (3-glycidoxypropyl)tripropoxysilane; and (3-glycidoxypropyl)triisopropoxysilane.

Of the trialkoxysilanes containing an epoxy group, preferably, glycidoxymethyltrialkoxysilane is used, or more preferably, (3-glycidoxypropyl)trimethoxysilane is used.

The mixing ratio of the silicon compound containing an epoxy group with respect to 100 parts by mass of the condensation material is, for example, 0.01 to 90 parts by mass, preferably 0.01 to 50 parts by mass, or more preferably 0.01 to 1 parts by mass.

A commercially available product can be used as the silicon compound containing an epoxy group. A silicon compound containing an epoxy group synthesized in accordance with a known method can be also used.

The molar ratio ($SiOH/(SiX^1+SiX^2)$) of the silanol group (the SiOH group) in the polysiloxane containing silanol groups at both ends to the reactive functional group (the $SiX^1$ group and the $SiX^2$ group) in the ethylenic silicon compound and the silicon compound containing an epoxy group is, for example, 20/1 to 0.2/1, preferably 10/1 to 0.5/1, or more preferably substantially 1/1.

When the molar ratio exceeds the above-described upper limit, there may be a case where a product in a semi-cured state (a semi-cured product) having an appropriate toughness is not obtained when the condensation/addition reaction curable type silicone resin composition is brought into a semi-cured state. On the other hand, when the molar ratio is below the above-described lower limit, the mixing proportion of the ethylenic silicon compound and the silicon compound containing an epoxy group is excessively large, so that the heat resistance of the encapsulating resin layer to be obtained may be reduced.

When the molar ratio is within the above-described range (preferably, substantially 1/1), the silanol group (the SiOH group) in the polysiloxane containing silanol groups at both ends, and the reactive functional group (the $SiX^1$ group) in the ethylenic silicon compound and the reactive functional group (the $SiX^2$ group) in the silicon compound containing an epoxy group can be allowed to undergo the condensation reaction neither too much nor too little.

The molar ratio of the ethylenic silicon compound to the silicon compound containing an epoxy group is, for example, 10/90 to 99/1, preferably 50/50 to 97/3, or more preferably 80/20 to 95/5.

When the molar ratio is within the above-described range, there is an advantage that the adhesiveness of a cured product can be improved, while the strength thereof is ensured.

The organohydrogensiloxane is an organosiloxane having, in one molecule, at least two hydrosilyl groups without containing an ethylenically unsaturated hydrocarbon group.

To be specific, an example of the organohydrogensiloxane includes an organopolysiloxane containing a hydrogen atom in its side chain and an organopolysiloxane containing hydrogen atoms at both ends.

The organopolysiloxane containing a hydrogen atom in its side chain is an organohydrogensiloxane having a hydrogen atom as a side chain which branches off from the main chain. Examples thereof include methylhydrogenpolysiloxane, dimethylpolysiloxane-co-methylhydrogenpolysiloxane, ethylhydrogenpolysiloxane, and methylhydrogenpolysiloxane-co-methylphenylpolysiloxane.

The number average molecular weight of the organopolysiloxane containing a hydrogen atom in its side chain is, for example, 100 to 1000000.

The organopolysiloxane containing hydrogen atoms at both ends is an organohydrogensiloxane having hydrogen atoms at both ends of the main chain. Examples thereof include a polydimethylsiloxane containing hydrosilyl groups at both ends, a polymethylphenylsiloxane containing hydrosilyl groups at both ends, and a polydiphenylsiloxane containing hydrosilyl groups at both ends.

The number average molecular weight of the organopolysiloxane containing hydrogen atoms at both ends is, for example, in view of stability and/or handling ability, 100 to 1000000, or preferably 100 to 100000.

The organohydrogensiloxanes can be used alone or in combination.

Of the organohydrogensiloxanes, preferably, an organopolysiloxane containing a hydrogen atom in its side chain is used, or more preferably, dimethylpolysiloxane-co-methylhydrogenpolysiloxane is used.

The viscosity of the organohydrogensiloxane at 25° C. is, for example, 10 to 100000 mPa·s, or preferably 20 to 50000 mPa·s. The viscosity is measured with an E-type viscometer.

The hydrosilyl group equivalent in the organohydrogensiloxane is, for example, 0.1 to 30 mmol/g, or preferably 1 to 20 mmol/g.

A commercially available product can be used as the organohydrogensiloxane. An organohydrogensiloxane synthesized in accordance with a known method can be also used.

The mixing ratio of the organohydrogensiloxane with respect to 100 parts by mass of the ethylenic silicon compound is, though depending on the molar ratio of the ethylenically unsaturated hydrocarbon group ($R^2$ in the above-described general formula (2)) in the ethylenic silicon compound to the hydrosilyl group (the SiH group) in the organohydrogensiloxane, for example, 10 to 10000 parts by mass, or preferably 100 to 1000 parts by mass.

The molar ratio ($R^2$/SiH) of the ethylenically unsaturated hydrocarbon group ($R^2$ in the above-described general formula (2)) in the ethylenic silicon compound to the hydrosilyl group (the SiH group) in the organohydrogensiloxane is, for example, 20/1 to 0.05/1, preferably 20/1 to 0.1/1, more preferably 10/1 to 0.1/1, particularly preferably 10/1 to 0.2/1, or most preferably 5/1 to 0.2/1. The molar ratio thereof can be also set to be, for example, less than 1/1 and not less than 0.05/1.

When the molar ratio exceeds 20/1, there may be a case where a semi-cured product having an appropriate toughness is not obtained when the condensation/addition reaction curable type silicone resin composition is brought into a semi-cured state. On the other hand, when the molar ratio is below 0.05/1, the mixing proportion of the organohydrogensiloxane is excessively large, so that the heat resistance and the toughness of the encapsulating resin layer to be obtained may be insufficient.

When the molar ratio is less than 1/1 and not less than 0.05/1, in allowing the condensation/addition reaction curable type silicone resin composition to be brought into a semi-cured state, the condensation/addition reaction curable type silicone resin composition can be quickly transferred into a semi-cured state, compared to the condensation/addition reaction curable type silicone resin composition whose molar ratio is 20/1 to 1/1.

The above-described polysiloxane containing silanol groups at both ends, ethylenic silicon compound, silicon compound containing an epoxy group, and organohydrogensiloxane are blended with a catalyst to be stirred and mixed, so that the condensation/addition reaction curable type silicone resin composition is prepared.

Examples of the catalyst include a condensation catalyst and an addition catalyst (a hydrosilylation catalyst).

The condensation catalyst is not particularly limited as long as it is a substance capable of improving the reaction rate of the condensation reaction of the silanol group with the reactive functional group (the $SiX^1$ group in the above-described general formula (2) and the $SiX^2$ group in the above-described general formula (3)). Examples of the condensation catalyst include an acid such as hydrochloric acid, acetic acid, formic acid, and sulfuric acid; a base such as potassium hydroxide, sodium hydroxide, potassium carbonate, and tetramethylammonium hydroxide; and a metal such as aluminum, titanium, zinc, and tin.

The condensation catalysts can be used alone or in combination.

Of the condensation catalysts, in view of compatibility and thermal decomposition characteristics, preferably, a base is used, or more preferably, tetramethylammonium hydroxide is used.

The mixing ratio of the condensation catalyst with respect to 100 mol of the polysiloxane containing silanol groups at both ends is, for example, 0.1 to 50 mol, or preferably 0.5 to 5 mol.

The addition catalyst is not particularly limited as long as it is a substance capable of improving the reaction rate of the addition reaction, that is, the hydrosilylation reaction of the ethylenically unsaturated hydrocarbon group with the SiH. An example of the addition catalyst includes a metal catalyst such as a platinum catalyst including platinum black, platinum chloride, chloroplatinic acid, a platinum olefin complex, a platinum carbonyl complex, and platinum acetyl acetate; a palladium catalyst; and a rhodium catalyst.

The addition catalysts can be used alone or in combination.

Of the addition catalysts, in view of compatibility, transparency, and catalyst activity, preferably, a platinum catalyst is used, or more preferably, a platinum carbonyl complex is used.

The mixing ratio of the addition catalyst with respect to 100 parts by mass of the organohydrogensiloxane is, as the number of parts by mass of the metal amount in the addition catalyst, for example, $1.0 \times 10^{-4}$ to 1.0 parts by mass, preferably $1.0 \times 10^{-4}$ to 0.5 parts by mass, or more preferably $1.0 \times 10^{-4}$ to 0.05 parts by mass.

As the above-described catalyst, a catalyst in a solid state can be used as it is. Alternatively, in view of handling ability, a catalyst dissolved or dispersed in a solvent can be used as a solution or a dispersion liquid.

Examples of the solvent include water and an alcohol such as methanol and ethanol. Preferably, an alcohol is used.

In order to prepare the condensation/addition reaction curable type silicone resin composition, for example, the above-described materials (the condensation materials and the addition materials) and the catalysts can be added simultaneously. Alternatively, each of the materials and each of the catalysts can be added, respectively, at different timings. Furthermore, a part of the components can be added simultaneously and each of the remaining components can be added, respectively, at different timings.

Of the preparing methods of the condensation/addition reaction curable type silicone resin composition, preferably, the following method is used. The condensation materials and the condensation catalyst are first added simultaneously. Next, the addition material is added thereto and then, the addition catalyst is added thereto.

To be specific, the polysiloxane containing silanol groups at both ends, the ethylenic silicon compound, and the silicon compound containing an epoxy group (that is, the condensation materials) are simultaneously blended with the condensation catalyst at the above-described proportion to be stirred for, for example, 5 minutes to 24 hours.

At the time of blending and stirring, the temperature can be also adjusted to, for example, 0 to 60° C. so as to improve the compatibility and the handling ability of the condensation materials.

At the time of blending of the materials and the condensation catalyst, a compatibilizing agent for improving the compatibility thereof can be added at an appropriate proportion.

An example of the compatibilizing agent includes an organic solvent such as an alcohol including methanol. When the condensation catalyst is prepared as a solution or a dispersion liquid of the organic solvent, the organic solvent can serve as the compatibilizing agent.

Thereafter, the pressure in the system (the above-described mixture) is reduced as required, so that a volatile component (the organic solvent) is removed.

Next, the organohydrogensiloxane is blended into the obtained mixture of the condensation materials and the condensation catalyst to be stirred for, for example, 1 to 120 minutes.

At the time of blending and stirring, the temperature can be also adjusted to, for example, 0 to 60° C. so as to improve the compatibility and the handling ability of the mixture and the organohydrogensiloxane.

Thereafter, the addition catalyst is blended into the system (the above-described mixture) to be stirred for, for example, 1 to 60 minutes.

In this way, the condensation/addition reaction curable type silicone resin composition can be prepared.

The prepared condensation/addition reaction curable type silicone resin composition is, for example, in a liquid state (in an oil state). As described later, after the condensation/addition reaction curable type silicone resin composition is applied onto a release sheet, the condensation materials are allowed to undergo a condensation reaction by heating. As described later, after the condensation/addition reaction curable type silicone resin composition encapsulates a light emitting diode, the addition material is allowed to undergo an addition reaction by further heating, so that the condensation/addition reaction curable type silicone resin is formed.

The thermoplastic/thermosetting silicone resin composition is a silicone resin composition having both thermoplastic properties and thermosetting properties.

Examples of the thermoplastic/thermosetting silicone resin composition include a first silicone resin composition, a second silicone resin composition, a third silicone resin composition, a fourth silicone resin composition, a fifth silicone resin composition, and a sixth silicone resin composition.

The first silicone resin composition contains, for example, a silicone resin composition containing amino groups at both ends, a diisocyanate, and a radical generator.

The silicone resin composition containing amino groups at both ends is, preferably, in view of transparency and high heat resistance, a compound represented by the following formula (5).

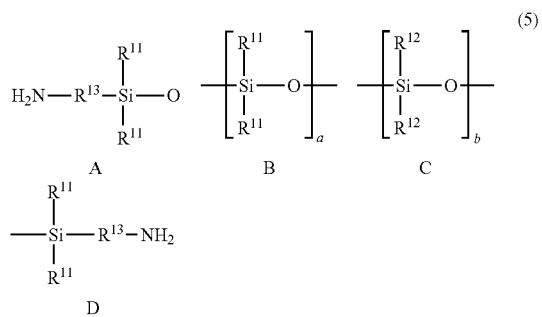

(where, in formula, A to D represent a constituent unit, A and D represent an end unit, and B and C represent a repeating unit. $R^{11}$ represents a monovalent hydrocarbon group, $R^{12}$ represents an alkenyl group, and $R^{13}$ represents an alkylene group. "a" represents an integer of 0 or 1 or more and "b" represents an integer of 0 or 1 or more. "a+b" satisfies the relationship of being an integer of at least 1 or more. All of the $R^{11}$s may be the same or different from each other and "b" pieces of $R^{12}$ may be the same or different from each other.)

The compound represented by formula (5) consists of the constituent units A, B, C, and D and is a compound containing an amino group (—$NH_2$) in its end unit.

The hydrocarbon group represented by $R^{11}$ in formula (5) is, for example, a saturated hydrocarbon group or an aromatic hydrocarbon group. The number of carbon atoms in the hydrocarbon group is, in view of availability, for example, 1 to 20, or preferably 1 to 10.

An example of the saturated hydrocarbon group includes an alkyl group such as methyl, ethyl, propyl, butyl, pentyl, hexyl, cyclohexyl, and cyclopentyl. An example of the aromatic hydrocarbon group includes an aryl group such as phenyl, benzyl, and tolyl.

Of the hydrocarbon groups represented by $R^{11}$, in view of transparency and light resistance of the obtained first silicone resin composition, preferably, methyl and phenyl are used, or more preferably, methyl is used. In formula (5), preferably, all of the $R^{11}$s are independent respectively, regardless of the constituent unit, and represent the above-described hydrocarbon group.

Examples of $R^{12}$ in formula (5) include a substituted or unsubstituted alkenyl group. To be specific, an organic group containing an alkenyl group in the skeleton is used. Examples thereof include vinyl, allyl, butynyl, pentynyl, and hexynyl. Among all, in view of transparency and heat resistance of the obtained first silicone resin composition, preferably, vinyl is used.

Examples of $R^{13}$ in formula (5) include a substituted or unsubstituted alkylene group. To be specific, an organic group containing an alkylene group in the skeleton is used. The number of carbon atoms in the organic group is, in view of transparency and heat resistance of the obtained first silicone resin composition, for example, 1 to 10. To be specific, examples thereof include methylene, ethylene, propylene, butylene, pentylene, hexylene, and heptylene. Among all, in view of transparency and heat resistance of the obtained first silicone resin composition, preferably, propylene is used. In formula (5), all of the $R^{13}$s, that is, two $R^{13}$s may be the same or different from each other.

The constituent unit A is an end unit and to be specific, is contained in one end of a molecule. That is, one constituent unit A is contained in formula (5).

The constituent unit D is an end unit and to be specific, is contained in the other end of the molecule, which is the opposite side of the constituent unit A. That is, one constituent unit D is contained in formula (5).

The repeating unit number of the constituent unit B, that is, "a" in formula (5) represents an integer of 0 or 1 or more and is, in view of transparency of the obtained first silicone resin composition, for example, an integer of 1 to 10000, or preferably an integer of 10 to 10000.

The repeating unit number of the constituent unit C, that is, "b" in formula (5) is, in view of transparency of the obtained first silicone resin composition, for example, an integer of 0 to 10000, or preferably an integer of 0 to 1000.

The sum of "a" and "b" is preferably 1 to 10000, or more preferably 10 to 10000. The sum of "a" and "b" is an integer of at least 1 or more and therefore, either "a" or "b" may be 0.

A commercially available product can be used as the silicone resin composition containing amino groups at both ends represented by formula (5). The silicone resin composition containing amino groups at both ends can be also synthesized in accordance with a known method.

The weight average molecular weight of the silicone resin composition containing amino groups at both ends represented by formula (5) is, in view of stability and handling ability, for example, 100 to 1000000, or preferably 1000 to 100000. The weight average molecular weight is measured with a gel permeation chromatography (GPC: calibrated with standard polystyrene equivalent) and the same applies hereinafter.

The content of the silicone resin composition containing amino groups at both ends in the first silicone resin composition is, for example, 1 to 99.9 mass %, or preferably 80 to 99.9 mass %.

The diisocyanate is, in view of compatibility with each of the components, for example, represented by the following formula (6).

$$O=C=N-Y-N=C=O \quad (6)$$

(where, in formula, Y represents a divalent hydrocarbon group.)

Examples of Y in formula (6) include a saturated or unsaturated straight chain, branched chain, or cyclic hydrocarbon group. The number of carbon atoms in the hydrocarbon group is, in view of availability and heat resistance of the obtained first silicone resin composition, for example, 1 to 50, or preferably 1 to 30.

Examples of the diisocyanate include an aliphatic diisocyanate, an aromatic diisocyanate, an alicyclic diisocyanate, or modified forms thereof. To be specific, examples of the diisocyanate include hexamethylene diisocyanate, 4,4'-methylene dicyclohexylene diisocyanate, 4,4'-methylene diphenylene diisocyanate, 1,3-diazetidine-2,4-dione-bis(4,4'-methylene dicyclohexyl)diisocyanate, 1,3-diazetidine-2,4-dione-bis(4,4-methylene diphenyl)diisocyanate, tetramethylene xylylene diisocyanate, isophorone diisocyanate, tolylene2,4-diisocyanate, and dicyclohexylmethylene diisocyanate. These can be used alone or in combination of two or more. Of these, in view of transparency, heat resistance, and availability, preferably, tolylene2,4-diisocyanate, isophorone diisocyanate, and hexamethylene diisocyanate are used.

A commercially available product can be used as the diisocyanate. The diisocyanate can be also synthesized in accordance with a known method.

The content of the diisocyanate in the first silicone resin composition is, for example, $1.0 \times 10^{-5}$ to 20 mass %, or preferably $1.0 \times 10^{-5}$ to 10 mass %.

In the mass ratio of the silicone resin composition containing amino groups at both ends to the diisocyanate, in view of allowing the amino group in the silicone resin composition containing amino groups at both ends to react with the isocyanate group in the diisocyanate neither too much nor too little, the molar ratio (the amino group/the isocyanate group) of the functional groups is, for example, 0.1/1 to 1/0.1, or preferably substantially equal in amount (1/1).

The radical generator is a compound which generates a radical and accelerates a cross-linking reaction among the silicone resin compositions containing amino groups at both ends. Examples thereof include a photo radical generator and an organic peroxide. The first silicone resin composition shows thermoplastic properties/thermosetting properties according to the temperature. Therefore, preferably, an organic peroxide which generates a radical by heating is used.

To be specific, examples of the radical generator include methyl ethyl ketone peroxide, cyclohexanone peroxide, methylcyclohexanone peroxide, acetylacetone peroxide, 1,1-di(t-hexylperoxy)-3,3,5-trimethylcyclohexane, 1,1-di(t-hexylperoxy)cyclohexane, 1,1-di(t-butylperoxy)-2-methylcyclohexane, 1,1-di(t-butylperoxy)cyclohexane, 2,2-di(t-butylperoxy)butane, 2,2-di(4,4-di-(butylperoxy)cyclohexyl)propane, p-methane hydroperoxide, diisopropylbenzene hydroperoxide, 1,1,3,3-tetramethylbutyl hydroperoxide, cumene hydroperoxide, t-butyl hydroperoxide, dicumyl peroxide, 2,5-dimethyl-2,5-di(t-butylperoxy)hexane, t-butylcumyl peroxide, di-t-hexyl peroxide, di-t-butyl peroxide, diisobutyryl peroxide, di-n-octanoyl peroxide, dibenzoyl peroxide, di-n-propyl peroxydicarbonate, diisopropyl peroxydicarbonate, di(4-t-butylcyclohexyl)peroxycarbonate, t-hexyl peroxyneodecanoate, t-butyl peroxyneodecanoate, t-butyl peroxydiisobutyrate, t-butyl peroxyallylmonocarbonate, and t-butyl peroxybenzene. These can be used alone or in combination of two or more. Of these, in view of transparency, heat resistance, and availability, preferably, di-t-butyl peroxide, 2,5-dimethyl-2,5-di(t-butylperoxy)hexane, and t-butyl peroxybenzene are used.

The temperature at which these radical generators generate a radical is not unconditionally determined and is, for example, 100° C. or more.

A commercially available product can be used as the radical generator. The radical generator can be also synthesized in accordance with a known method.

The content of the radical generator in the first silicone resin composition is, for example, $1.0 \times 10^{-6}$ to 20 mass %, or preferably $1.0 \times 10^{-6}$ to 10 mass %.

The content of the radical generator with respect to 100 mol % of $R^{11}$ group amount in the silicone resin composition containing amino groups at both ends is, in view of maintaining flexibility of the obtained first silicone resin composition, for example, 0.001 to 50 mol %, or preferably 0.01 to 10 mol %.

The first silicone resin composition can be prepared without any particular limitation as long as it contains the silicone resin composition containing amino groups at both ends, the diisocyanate, and the radical generator.

In the first silicone resin composition, the reaction temperature and the duration are appropriately selected according to the respective reaction mechanism of the reaction of the isocyanate group and the cross-linking reaction by the radical generator to progress and terminate the reactions. In this way, preferably, components related to the reaction of the isocyanate group, that is, the silicone resin composition containing amino groups at both ends and the diisocyanate are mixed in advance and then, the radical generator is blended thereto.

The mixing of the components related to the reaction of the isocyanate group is performed by stirring the silicone resin composition containing amino groups at both ends and the diisocyanate, and an additive such as an organic solvent as required at, for example, 0 to 100° C., or preferably 10 to 60° C. for, for example, 0.1 to 40 hours.

The organic solvent is not particularly limited and in view of improving compatibility of each of the components, preferably, ketone such as methyl ethyl ketone is used.

By the above-described mixing, a part of the reaction of the amino group in the silicone resin composition containing amino groups at both ends with the isocyanate group in the diisocyanate may start. The degree of progress of the reaction can be checked by $^1$H-NMR measurement based on the degree of disappearance of the peak derived from the amino group.

Next, as a component related to the cross-linking reaction, the radical generator is mixed in a mixture of the components related to the reaction of the isocyanate group described above. In the first silicone resin composition, a cured product (a molded product) can be obtained by the occurrence of the cross-linking reaction on obtaining the cured product by performing two types of the reactions, that is, the reaction of the isocynate group and the cross-linking reaction by the radical generator. Therefore, the mixing method is not particularly limited as long as the radical generator is uniformly mixed into the mixture of the components related to the reaction of the isocyanate group described above.

To be specific, the radical generator is blended into the mixture of the silicone resin composition containing amino groups at both ends and the diisocyanate to be stirred and mixed. The mixing duration is not unconditionally determined according to the reaction temperature and the type and amount of the component subjected to the reaction and is, for example, 0.1 to 40 hours. In the obtained mixture (the reactant), a solvent or the like can be removed in accordance with a known method.

The first silicone resin composition obtained in this way is solid under normal temperature, shows a thermoplastic behavior at 40° C. or more, and furthermore, shows the thermosetting properties at 50° C. or more.

To be specific, the thermoplastic temperature of the first silicone resin composition is preferably 40 to 200° C., or more preferably 80 to 150° C. The thermoplastic temperature is the temperature at which the first silicone resin composition shows the thermoplastic properties. To be specific, the thermoplastic temperature is the temperature at which the first silicone resin composition in a solid state is softened by heating to be brought into a completely liquid state and is substantially the same as the softening temperature.

The thermosetting temperature of the first silicone resin composition is preferably 100 to 200° C., or more preferably 130 to 200° C. The thermosetting temperature is the temperature at which the first silicone resin composition shows the thermosetting properties. To be specific, the thermosetting temperature is the temperature at which the first silicone resin composition in a liquid state is cured by heating to be brought into a completely solid state.

The second silicone resin composition contains, for example, a silicone resin composition containing amino groups at both ends, an organohydrogenpolysiloxane, a diisocyanate, and a hydrosilylation catalyst.

An example of the silicone resin composition containing amino groups at both ends in the second silicone resin composition includes the same silicone resin composition containing amino groups at both ends as that illustrated in the first silicone resin composition. In the silicone resin composition containing amino groups at both ends in the second silicone resin composition, "b" represents an integer of 1 or more in the above-described formula (5).

The content of the silicone resin composition containing amino groups at both ends in the second silicone resin composition is, for example, 1 to 99.5 mass %, or preferably 80 to 99.5 mass %.

The organohydrogenpolysiloxane is a polysiloxane containing a hydrosilyl group (—SiH). To be more specific, the organohydrogenpolysiloxane is in a straight chain and an example thereof includes a side-chain type organohydrogenpolysiloxane, which contains a hydrosilyl group in its side chain bonded to the main chain, and/or a dual-end type organohydrogenpolysiloxane, which contains hydrosilyl groups at both ends of a molecule.

The side-chain type organohydrogenpolysiloxane is, for example, represented by the following formula (7).

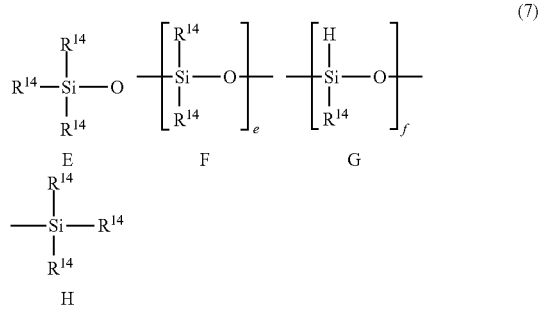

(where, in formula, E to H represent a constituent unit, E and H represent an end unit, and F and G represent a repeating unit. $R^{14}$ represents a monovalent hydrocarbon group. "e" represents an integer of 0 or more and "f" represents an integer of 1 or more.)

E to H constitute the side-chain type organohydrogenpolysiloxane.

The monovalent hydrocarbon groups represented by $R^{14}$ in formula (7) may be the same or different from each other. Preferably, the monovalent hydrocarbon groups represented by $R^{14}$ are the same.

An example of the monovalent hydrocarbon group represented by $R^{14}$ includes the same monovalent hydrocarbon group as that represented by $R^{11}$ in the above-described formulas (5) and (6). Preferably, methyl and phenyl are used, or more preferably, methyl is used.

"e" represents, in view of reactivity and stability, preferably an integer of 1 to 10000, or more preferably an integer of 1 to 5000.

"f" represents preferably an integer of 2 or more, and also represents, in view of reactivity and stability, preferably an integer of 1 to 10000, more preferably an integer of 1 to 1000. "f" represents, in view of imparting flexibility to the silicone resin composition while obtaining it in a solid state at room temperature, particularly preferably an integer larger than "e", or most preferably an integer of 100 to 1000.

Examples of the side-chain type organohydrogenpolysiloxane include methylhydrogensiloxane, dimethylsiloxane-co-methylhydrogensiloxane, ethylhydrogensiloxane, and methylhydrogensiloxane-co-methylphenylsiloxane.

The number average molecular weight of the side-chain type organohydrogenpolysiloxane is, in view of stability and handling ability, for example, 200 to 100000, or preferably 200 to 80000.

The side-chain type organohydrogenpolysiloxane can be, for example, synthesized in accordance with a known method. A commercially available product (for example, manufactured by Gelest, Inc., and Shin-Etsu Chemical Co., Ltd.) can be also used.

The dual-end type organohydrogenpolysiloxane is, for example, represented by the following formula (8).

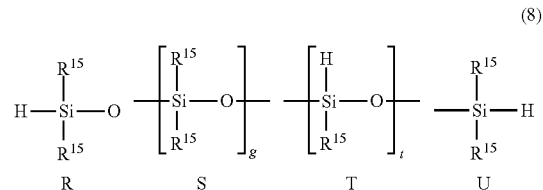

(where, in formula, R to U represent a constituent unit, R and U represent an end unit, and S and T represent a repeating unit. $R^{15}$ represents a monovalent hydrocarbon group selected from a saturated hydrocarbon group and an aromatic hydrocarbon group. "g" represents an integer of 0 or more and "t" represents an integer of 0 or more. "g+t" satisfies the relationship of being an integer of at least 1 or more.)

R to U constitute the dual-end type organohydrogenpolysiloxane.

The monovalent hydrocarbon groups represented by $R^{15}$ in formula (8) may be the same or different from each other. Preferably, the monovalent hydrocarbon groups represented by $R^{15}$ are the same.

An example of the monovalent hydrocarbon group represented by $R^{15}$ includes the same monovalent hydrocarbon group as that represented by $R^{11}$ in the above-described formula (5). As the monovalent hydrocarbon group represented by $R^{15}$, preferably, a methyl group and a phenyl group are used, or more preferably, a methyl group is used.

"g" represents, in view of reactivity and stability, preferably an integer of 0 or more, more preferably an integer of 1 to 10000, or particularly preferably an integer of 1 to 5000.

"t" represents, in view of reactivity and stability, preferably an integer of 0 or more, more preferably an integer of 1 to 10000, or particularly preferably an integer of 1 to 5000.

The dual-end type organohydrogenpolysiloxane is, for example, when "t" is 1 or more (that is, "g" is 0 or more), an organopolysiloxane containing both a hydrogen atom in its side chain and hydrogen atoms at both ends, which contains a hydrogen atom in the side chain branched off from the main chain and hydrogen atoms at both ends of the main chain. To be specific, examples thereof include a methylhydrogenpolysiloxane containing hydrosilyl groups at both ends, a (dimethylpolysiloxane-co-methylhydrogenpolysiloxane) containing hydrosilyl groups at both ends, an ethylhydrogenpolysiloxane containing hydrosilyl groups at both ends, and a (methylhydrogenpolysiloxane-co-methylphenylpolysiloxane) containing hydrosilyl groups at both ends.

The dual-end type organohydrogenpolysiloxane is, for example, when "t" is 0 (that is, "g" is 1 or more), an organopolysiloxane containing no hydrogen atom in its side chain/containing hydrogen atoms at both ends, which does not contain a hydrogen atom in the side chain branched off from the main chain and contains hydrogen atoms at both ends of the main chain. To be specific, examples thereof include a polydimethylsiloxane containing hydrosilyl groups at both ends, a polymethylphenylsiloxane containing hydrosilyl groups at both ends, and a polydiphenylsiloxane containing hydrosilyl groups at both ends.

As the dual-end type organohydrogenpolysiloxane, preferably, an organopolysiloxane containing no hydrogen atom in its side chain/containing hydrogen atoms at both ends represented by formula (9) is used.

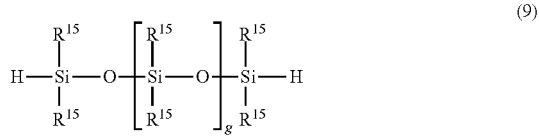

(9)

(where, in formula, $R^{15}$ represents a monovalent hydrocarbon group selected from a saturated hydrocarbon group and an aromatic hydrocarbon group. "g" represents an integer of 1 or more.)

The monovalent hydrocarbon groups represented by $R^{15}$ in formula (9) may be the same or different from each other. Preferably, the monovalent hydrocarbon groups represented by $R^{15}$ are the same.

In formula (9), $R^{15}$ is the same as that in the description above and "g" is the same as that in the description above.

The number average molecular weight of the dual-end type organohydrogenpolysiloxane is, in view of stability and handling ability, for example, 100 to 30000, or preferably 100 to 10000.

The dual-end type organohydrogenpolysiloxane can be, for example, synthesized in accordance with a known method. A commercially available product can be also used.

To be specific, the content of the hydrosilyl group in the organohydrogenpolysiloxane is, for example, 0.01 to 20 mmol/g, or preferably 0.05 to 15 mmol/g. The content of the hydrosilyl group is calculated from the integral value of the hydrosilyl group and the methyl group with a $^1$H-NMR.

The organohydrogenpolysiloxane can be, for example, synthesized in accordance with a known method. A commercially available product (for example, manufactured by Gelest, Inc., and Shin-Etsu Chemical Co., Ltd.) can be also used.

The content of the organohydrogenpolysiloxane in the second silicone resin composition is, for example, 0.0001 to 90 mass %, or preferably 0.001 to 50 mass %.

In the mass ratio of the silicone resin composition containing amino groups at both ends to the organohydrogenpolysiloxane, in view of allowing the alkenyl group in the silicone resin composition containing amino groups at both ends to react with the SiH group (the hydrosilyl group) in the organohydrogenpolysiloxane neither too much nor too little, the molar ratio (the alkenyl group/the SiH group) of the functional groups is, for example, 1/1 to 0.1/1, preferably 1/1 to 0.2/1, more preferably 1/1 to 0.5/1, or particularly preferably substantially equal in amount (1/1).

An example of the diisocyanate includes the same diisocyanate as that illustrated in the first silicone resin composition.

The content of the diisocyanate in the second silicone resin composition is, for example, $1.0 \times 10^{-5}$ to 20 mass %, or preferably $1.0 \times 10^{-5}$ to 10 mass %.

In the mass ratio of the silicone resin composition containing amino groups at both ends to the diisocyanate, in view of allowing the amino group in the silicone resin composition containing amino groups at both ends to react with the isocyanate group in the diisocyanate neither too much nor too little, the molar ratio (the amino group/the isocyanate group) of the functional groups is, for example, 1/1 to 0.1/1, preferably 1/1 to 0.2/1, more preferably 1/1 to 0.5/1, or particularly preferably substantially equal in amount (1/1).

The hydrosilylation catalyst is not particularly limited as long as it is a compound which catalyzes the hydrosilylation reaction of the alkenyl group in the silicone resin composition containing amino groups at both ends with the hydrosilyl group in the organohydrogenpolysiloxane. Examples of the hydrosilylation catalyst include a platinum catalyst such as platinum black, platinum chloride, chloroplatinic acid, a platinum olefin complex, a platinum carbonyl complex, and platinum acetyl acetate; a palladium catalyst; and a rhodium catalyst.

In the content of the hydrosilylation catalyst in the second silicone resin composition, for example, when the platinum catalyst is used, in view of reaction rate, the content of the platinum with respect to 100 parts by mass of the organohydrogenpolysiloxane is, for example, $1.0 \times 10^{-10}$ to 0.5 parts by mass, or preferably $1.0 \times 10^{-8}$ to $1.0 \times 10^{-3}$ parts by mass.

The second silicone resin composition can be prepared without any particular limitation as long as it contains each of the components of the silicone resin composition containing amino groups at both ends, the organohydrogenpolysiloxane, the diisocyanate, and the hydrosilylation catalyst.

In the second silicone resin composition, the reaction temperature and the duration are appropriately selected according to the respective reaction mechanism of the reaction of the isocyanate group and the hydrosilylation reaction to progress and terminate the reactions. In this way, components related to the reaction of the isocyanate group are mixed in advance and then, the components related to the hydrosilylation reaction may be mixed thereto.

The mixing of the components related to the reaction of the isocyanate group can be performed by stirring the silicone resin composition containing amino groups at both ends and the diisocyanate, and an additive such as an organic solvent as required at, for example, 0 to 100° C., or preferably 10 to 60° C. for, for example, 0.1 to 40 hours.

The organic solvent is not particularly limited and in view of improving compatibility of each of the components, preferably, ketone such as methyl ethyl ketone is used.

By the above-described mixing, a part of the reaction of the amino group in the silicone resin composition containing amino groups at both ends with the isocyanate group in the diisocyanate may start. The degree of progress of the reaction can be checked by $^1$H-NMR measurement based on the degree of disappearance of the peak derived from the amino group.

Thereafter, as components related to the hydrosilylation reaction, the organohydrogenpolysiloxane and the hydrosilylation catalyst are blended in a mixture of the components related to the reaction of the isocyanate group described above.

In the second silicone resin composition, by the subsequent heating, a cured product (a molded product) can be obtained by the occurrence of the above-described hydrosilylation reaction. Therefore, the mixing method is not particularly limited as long as the components related to the hydrosilylation reaction are uniformly mixed into the mixture of the components related to the reaction of the isocyanate group described above.

To be specific, the organohydrogenpolysiloxane and the hydrosilylation catalyst are blended into the mixture of the silicone resin composition containing amino groups at both ends and the diisocyanate to be stirred and mixed. The mixing duration is not unconditionally determined according to the reaction temperature and the type and amount of the component subjected to the reaction and is, for example, 0.1 to 40 hours. The mixing method is not particularly limited as long as each of the components is uniformly mixed. In the obtained mixture, a solvent or the like can be removed in accordance with a known method.

The second silicone resin composition obtained in this way is solid under normal temperature, shows a thermoplastic behavior at 40° C. or more, and furthermore, shows the thermosetting properties at 50° C. or more.

To be specific, the thermoplastic temperature of the second silicone resin composition is, for example, 40 to 200° C., or preferably 40 to 150° C.

In the following thermosetting temperature, in the second silicone resin composition, the hydrosilylation reaction is progressed and the second silicone resin composition is cured by heating.

The thermosetting temperature is, for example, 100 to 200° C., or preferably 130 to 200° C. The degree of progress of the hydrosilylation reaction can be checked by $^1$H-NMR measurement based on the intensity of a signal derived from the alkenyl group in the silicone resin composition containing amino groups at both ends. The reaction is considered to be terminated at the time of disappearance of the signal.

The third silicone resin composition is obtained by allowing a cage octasilsesquioxane to react with an alkenyl group-containing polysiloxane in the presence of a hydrosilylation catalyst.

The cage octasilsesquioxane is an octamer of trifunctional silicone monomer and to be specific, has eight groups represented by the following formula (10),

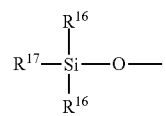

(where, in formula, $R^{16}$ represents a monovalent hydrocarbon group and $R^{17}$ represents hydrogen or a monovalent hydrocarbon group. The molar ratio of the monovalent hydrocarbon group: hydrogen in $R^{17}$ in the cage octasilsesquioxane as a whole is, as an average value, in the range of 6.5:1.5 to 5.5:2.5.)

To be more specific, the cage octasilsesquioxane is represented by the following formula

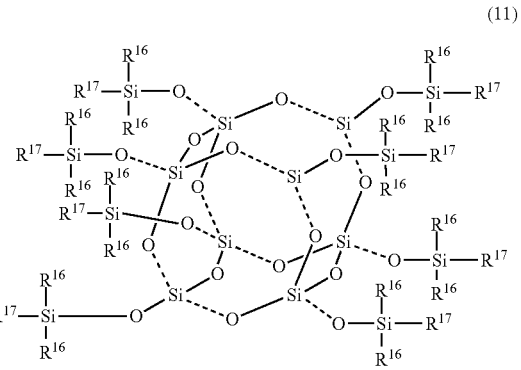

(where, in formula, $R^{16}$ and $R^{17}$ are the same as those in the description above. The molar ratio of the monovalent hydrocarbon group: hydrogen in $R^{16}$ is the same as that in the description above.)

An example of the monovalent hydrocarbon group represented by $R^{16}$ in the above-described formulas (10) and (11) includes a saturated hydrocarbon group or an aromatic hydrocarbon group.

Examples of the saturated hydrocarbon group include a straight chain saturated hydrocarbon group (for example, an alkyl group having 1 to 6 carbon atoms such as methyl, ethyl, propyl, butyl, pentyl, and hexyl), a branched chain saturated hydrocarbon group (for example, an alkyl group having 3 to 6 carbon atoms such as isopropyl and isobutyl), and a cyclic saturated hydrocarbon group (for example, a cycloalkyl group having 3 to 6 carbon atoms such as cyclohexyl).

An example of the aromatic hydrocarbon group includes an aryl group having 6 to 8 carbon atoms such as phenyl, benzyl, and tolyl.

The number of carbon atoms of the monovalent hydrocarbon group is, for example, 1 to 8, or preferably 1 to 6.

$R^{16}$s may be the same or different from each other. Preferably, $R^{16}$s are the same.

As the monovalent hydrocarbon group, preferably, in view of easy preparation and thermal stability, a saturated and straight chain hydrocarbon group is used, more preferably, an alkyl group having 1 to 6 carbon atoms is used, or particularly preferably, methyl is used.

An example of the monovalent hydrocarbon group represented by $R^{17}$ in the above-described formulas (10) and (11) includes the same monovalent hydrocarbon group as that represented by $R^{11}$ described above. Preferably, methyl is used.

The molar ratio of the monovalent hydrocarbon group: hydrogen in $R^{17}$ in formula (11), in the cage octasilsesquioxane as a whole, is in the range of 6.5:1.5 to 5.5:2.5, or preferably 6.0:2.0 to 5.5:2.5 as an average value.

That is, in one molecule of the cage octasilsesquioxane, the group represented by the above-described formula (10) forms 1.5 to 2.5 (to be specific, two), or preferably 2 to 2.5 (to be specific, two) of the hydrosilyl groups (—SiH).

When the above-described molar ratio of the monovalent hydrocarbon group: hydrogen in $R^{17}$ exceeds 6.5/1.5 (=6.5:1.5) (for example, 7/1 (=7:1)), the number of moles of the hydrosilyl group is excessively small and therefore, the reactivity of the cage octasilsesquioxane with respect to the alkenyl group-containing polysiloxane is excessively reduced. Thus, the molecular weight of the third silicone resin composition to be obtained is reduced and a solid silicone resin composition may not be obtained.

On the other hand, when the above-described molar ratio of the monovalent hydrocarbon group: hydrogen in $R^{17}$ is below 5.5/2.5 (=5.5:2.5) (for example, 5/3 (=5:3)), the number of moles of the hydrosilyl group in the cage octasilsesquioxane is excessively large and therefore, the reactivity of the cage octasilsesquioxane with respect to the alkenyl group-containing polysiloxane excessively increases. Thus, the third silicone resin composition may not show the thermoplastic properties.

To be specific, examples of the above-described cage octasilsesquioxane include a cage octasilsesquioxane having methyl in $R^{16}$ and methyl or hydrogen in $R^{17}$ in the above-described formulas (10) and (11) and having a molar ratio of methyl: hydrogen in $R^{17}$ in the cage octasilsesquioxane as a whole of 5.5:2.5, 6:2, or 6.5:1.5 as an average value.

The cage octasilsesquioxane represented by the above-described formula (11) is, for example, synthesized in accordance with a known method (for example, in conformity with the description in Japanese Unexamined Patent Publication No. 2007-246880).

To be specific, tetraalkoxysilane (tetraethoxysilane and the like) is allowed to react with an alcohol such as methanol and/or with water in the presence of a catalyst to synthesize an octa (silsesquioxane) skeleton (a portion in formula (11) excluding the groups of formula (10)) and thereafter, dialkylchlorosilane (dimethylchlorosilane and the like) and trialkylchlorosilane (trimethylchlorosilane and the like) are blended at a mixing proportion corresponding to the above-described molar ratio of the monovalent hydrocarbon group: hydrogen in $R^{17}$. Then, an alkoxyl group (ethoxy and the like) bonded to the silicon atom of the octa (silsesquioxane) skeleton is allowed to react with dialkylchlorosilane and trialkylchlorosilane. After the reaction, the reactant is refined as required. In this way, the cage octasilsesquioxane can be obtained.

A commercially available product can be also used as the cage octasilsesquioxane.

The alkenyl group-containing polysiloxane is a polysiloxane containing alkenyl groups at both ends which contains alkenyl groups at both ends of a molecule.

To be specific, the alkenyl group-containing polysiloxane is represented by the following formula (12).

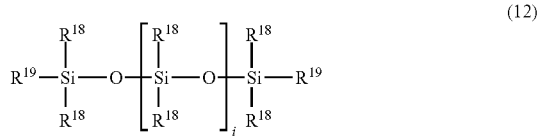

(12)

(where, in formula, $R^{18}$ represents a monovalent hydrocarbon group and $R^{19}$ represents an alkenyl group. "i" represents an integer of 1 or more.)

The monovalent hydrocarbon groups represented by $R^{18}$ in formula (12) may be the same or different from each other. Preferably, the monovalent hydrocarbon groups represented by $R^{18}$ are the same.

An example of the monovalent hydrocarbon group represented by $R^{18}$ includes the same monovalent hydrocarbon group as that represented by $R^{16}$ in the above-described formulas (10) and (11). Preferably, methyl and phenyl are used, or more preferably, methyl is used.

Examples of the alkenyl group represented by $R^{19}$ in formula (12) include a substituted or unsubstituted alkenyl group. Preferably, an unsubstituted alkenyl group is used.

An example of the alkenyl group includes an alkenyl group having 2 to 10 carbon atoms such as vinyl, allyl, propenyl, butenyl, and pentenyl.

The number of carbon atoms of the alkenyl group is, for example, 2 to 10, or preferably 2 to 5.

$R^{19}$s may be the same or different from each other. Preferably, $R^{19}$s are the same.

As the alkenyl group, preferably, in view of reactivity with the hydrosilyl group in the cage octasilsesquioxane, an alkenyl group having 2 to 5 carbon atoms is used, or more preferably, vinyl is used.

"i" represents, in view of reactivity and stability, preferably an integer of 1 to 5000, or more preferably an integer of 1 to 1000.

The number average molecular weight of the alkenyl group-containing polysiloxane represented by the above-described formula (12) is, in view of safety and handling ability, for example, 100 to 10000, or preferably 300 to 5000.

The alkenyl group-containing polysiloxane represented by the above-described formula (12) can be, for example, synthesized in accordance with a known method. A commercially available product (for example, manufactured by Gelest, Inc.) can be also used.

An example of the hydrosilylation catalyst includes the same hydrosilylation catalyst as that illustrated in the second silicone resin composition. As the hydrosilylation catalyst, preferably, in view of compatibility and transparency, a platinum catalyst is used, or more preferably, a platinum olefin complex is used. To be specific, a platinum-divinylsiloxane complex such as a platinum-1,3-divinyl-1,1,3,3-tetramethyl-disiloxane complex is used.

The hydrosilylation catalyst may be prepared as a solution in a known solvent (such as toluene).

The mixing ratio of the hydrosilylation catalyst (solid content) with respect to 100 parts by mass of the total amount of the cage octasilsesquioxane and the alkenyl group-containing polysiloxane is, for example, $1.0 \times 10^{-10}$ to 3 parts by mass, or preferably $1.0 \times 10^{-8}$ to 1 parts by mass.

The cage octasilsesquioxane is allowed to react with the alkenyl group-containing polysiloxane in the presence of the hydrosilylation catalyst so that the number of moles of the hydrosilyl group in the cage octasilsesquioxane is larger (excessive) than that of the alkenyl group in the alkenyl group-containing polysiloxane.

The molar ratio (the number of moles of the alkenyl group/the number of moles of the hydrosilyl group) of the alkenyl group to the hydrosilyl group is below 1, for example, 0.10 to 0.99, preferably 0.20 to 0.99, or more preferably 0.50 to 0.99.

On the other hand, when the above-described molar ratio exceeds the above-described range, the hydrosilyl group is fewer than the alkenyl group. In such a case, the excess of the hydrosilyl group does not remain after the reaction and the thermosetting properties may not be imparted to the third silicone resin composition.

In order to allow the above-described cage octasilsesquioxane to react with the above-described alkenyl group-containing polysiloxane, they are blended at the above-described mixing proportion, along with the hydrosilylation catalyst and the solvent, and thereafter, the mixture is heated as required.

Examples of the solvent include an aromatic hydrocarbon such as toluene, an aliphatic hydrocarbon such as hexane, and ester such as ethyl acetate. Preferably, in view of improving compatibility of each of the components, an aromatic hydrocarbon is used, or more preferably, toluene is used.

The reaction temperature is, for example, 0 to 100° C., or preferably 20 to 80° C. and the reaction duration is, for example, 0.5 to 96 hours.

In this way, the hydrosilyl group in the cage octasilsesquioxane and the alkenyl group in the alkenyl group-containing polysiloxane are allowed to undergo the hydrosilylation reaction.

The degree of the hydrosilylation reaction can be checked by $^1$H-NMR measurement based on the intensity of a signal derived from the alkenyl group in the alkenyl group-containing polysiloxane. The hydrosilylation reaction is considered to be terminated at the time of disappearance of the signal.

In the above-described hydrosilylation reaction, the cage octasilsesquioxane is allowed to react with the alkenyl group-containing polysiloxane so that the number of moles of the hydrosilyl group is excessive compared with the number of moles of the alkenyl group. Therefore, after the reaction, the excess of the hydrosilyl group remains and the excess of the hydrosilyl group is hydrolyzed with moisture in the air and undergoes a condensation reaction by the subsequent heating (for example, the heating at 100 to 200° C.). Then, the excess of the hydrosilyl group is bonded with each other (three-dimensional cross-linking) and in this way, the thermosetting properties are imparted to the third silicone resin composition.

In this way, the third silicone resin composition can be obtained.

The obtained third silicone resin composition is in a solid state. The third silicone resin composition in a solid state is obtained because the mobility of the alkenyl group-containing polysiloxane is reduced due to the steric hindrance of the cage octasilsesquioxane.

The thermoplastic temperature of the third silicone resin composition is, for example, 40 to 100° C., or preferably 50 to 90° C.

The thermosetting properties of the once plasticized third silicone resin composition are exhibited by hydrolysis and condensation reaction of the excess of the hydrosilyl group by the subsequent heating, causing the excess of the hydrosilyl group to bond with each other (three-dimensional cross-linking).

The thermosetting temperature of the third silicone resin composition is, for example, 150 to 300° C., or preferably 180 to 250° C.

The fourth silicone resin composition contains a cage octasilsesquioxane, an alkenyl group-containing polysiloxane, a hydrosilylation catalyst, and a hydroxyl group-containing polysiloxane.

Each example of the cage octasilsesquioxane, the alkenyl group-containing polysiloxane, and the hydrosilylation catalyst in the fourth silicone resin composition includes the same cage octasilsesquioxane as that illustrated in the third silicone resin composition, the same alkenyl group-containing polysiloxane as that illustrated in the third silicone resin composition, and the same hydrosilylation catalyst as that illustrated in the second silicone resin composition, respectively.

The hydroxyl group-containing polysiloxane is a polysiloxane containing a plurality (for example, two) of hydroxyl groups. To be more specific, the hydroxyl group-containing polysiloxane is a dual-end type polysiloxane containing hydroxyl groups at both ends of a molecule. To be more specific, the hydroxyl group-containing polysiloxane is represented by the following formula (13).

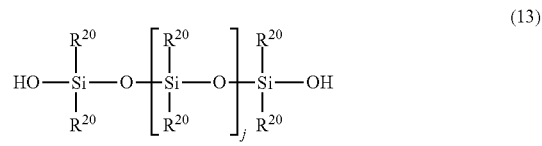

(where, in formula, $R^{20}$ represents a monovalent hydrocarbon group. "j" represents an integer of 1 or more.)

The monovalent hydrocarbon groups represented by $R^{20}$ in formula (13) may be the same or different from each other. Preferably, the monovalent hydrocarbon groups represented by $R^{20}$ are the same.

An example of the monovalent hydrocarbon group represented by $R^{20}$ includes the same monovalent hydrocarbon group as that represented by $R^{16}$ in the above-described formulas (9) and (10). Preferably, methyl and phenyl are used, or more preferably, methyl is used.

"j" represents, in view of reactivity and stability, preferably an integer of 1 to 10000, or more preferably an integer of 1 to 5000.

The number average molecular weight of the hydroxyl group-containing polysiloxane represented by the above-described formula (13) is, in view of safety and handling ability, for example, 100 to 100000, or preferably 500 to 50000.

The hydroxyl group-containing polysiloxane represented by the above-described formula (13) can be, for example, synthesized in accordance with a known method. A commercially available product (for example, manufactured by Gelest, Inc.) can be also used.

The cage octasilsesquioxane, the alkenyl group-containing polysiloxane, the hydrosilylation catalyst, and the hydroxyl group-containing polysiloxane are blended, so that the fourth silicone resin composition is prepared.

The mixing ratio of the cage octasilsesquioxane with respect to the fourth silicone resin composition is, for example, 1 to 50 mass %, or preferably 5 to 40 mass %.

The mixing proportion of the alkenyl group-containing polysiloxane is adjusted so that the number of moles of the alkenyl group in the alkenyl group-containing polysiloxane is smaller than that of the hydrosilyl group in the cage octasilsesquioxane.

That is, the molar ratio (the number of moles of the alkenyl group/the number of moles of the hydrosilyl group) of the alkenyl group to the hydrosilyl group is below 1, for example, 0.10 to 0.99, preferably 0.20 to 0.99, or more preferably 0.50 to 0.99.

When the above-described molar ratio exceeds the above-described range, the hydrosilyl group is fewer than the alkenyl group. In such a case, the excess of the hydrosilyl group does not remain after the reaction and the thermosetting properties may not be imparted to the fourth silicone resin composition.

On the other hand, when the above-described molar ratio is below the above-described range, the hydrosilyl group excessively remains and the cage octasilsesquioxanes themselves undergo hydrolysis by moisture in the air and a self-condensation reaction to be cured, so that flexibility may not be obtained.

The mixing ratio of the hydrosilylation catalyst (solid content) with respect to 100 parts by mass of the total amount of the cage octasilsesquioxane and the alkenyl group-containing polysiloxane is, for example, $1.0\times10^{-10}$ to 3 parts by mass, or preferably $1.0\times10^{-8}$ to 1 parts by mass.

The mixing ratio of the hydroxyl group-containing polysiloxane is adjusted so that the number of moles (X) of the hydroxyl group with respect to the number of moles (Y), which is obtained by subtracting the number of moles of the alkenyl group in the alkenyl group-containing polysiloxane from the number of moles of the hydrosilyl group in the cage octasilsesquioxane, as the molar ratio (X/Y), is, for example, 0.001 to 1000, or preferably 0.01 to 100. In other words, the mixing ratio of the hydroxyl group-containing polysiloxane with respect to 100 parts by mass of the total amount of the cage octasilsesquioxane and the alkenyl group-containing polysiloxane is, for example, 0.1 to 50 parts by mass, or preferably 1 to 30 parts by mass.

In order to prepare the fourth silicone resin composition, preferably, a silicone resin composition precursor, which is obtained by allowing the cage octasilsesquioxane to react with the alkenyl group-containing polysiloxane in the presence of the hydrosilylation catalyst, and the hydroxyl group-containing polysiloxane are blended.

That is, first, the cage octasilsesquioxane is allowed to react with the alkenyl group-containing polysiloxane in the presence of the hydrosilylation catalyst so that the number of moles of the hydrosilyl group in the cage octasilsesquioxane is larger (excessive) than that of the alkenyl group in the alkenyl group-containing polysiloxane. In this way, the silicone resin composition precursor is obtained.

To be more specific, in order to obtain the silicone resin composition precursor, the above-described cage octasilsesquioxane and the above-described alkenyl group-containing polysiloxane are blended at the above-described mixing proportion, along with the hydrosilylation catalyst, and the solvent as required, and thereafter, the mixture is heated as required.

Examples of the solvent include an aromatic hydrocarbon such as toluene, an aliphatic hydrocarbon such as hexane, and ester such as ethyl acetate. Preferably, in view of improving compatibility of each of the components, an aromatic hydrocarbon is used, or more preferably, toluene is used.

The reaction temperature is, for example, 0 to 100° C., or preferably 20 to 80° C. and the reaction duration is, for example, 0.5 to 96 hours.

In this way, the cage octasilsesquioxane is allowed to react with the alkenyl group-containing polysiloxane. That is, the hydrosilyl group in the cage octasilsesquioxane and the alkenyl group in the alkenyl group-containing polysiloxane are allowed to undergo the hydrosilylation reaction.

The degree of the hydrosilylation reaction of the hydrosilyl group in the cage octasilsesquioxane with the alkenyl group in the alkenyl group-containing polysiloxane can be checked by $^1$H-NMR measurement based on the intensity of a signal derived from the alkenyl group in the alkenyl group-containing polysiloxane. The hydrosilylation reaction is considered to be terminated at the time of disappearance of the signal.

In the above-described hydrosilylation reaction, the cage octasilsesquioxane is allowed to react with the alkenyl group-containing polysiloxane so that the number of moles of the hydrosilyl group is excessive compared with the number of moles of the alkenyl group. After the reaction, the excess of the hydrosilyl group remains.

In this way, the silicone resin composition precursor is obtained.

The silicone resin composition precursor is in a liquid state or in a semi-solid state.

Next, the obtained silicone resin composition precursor and hydroxyl group-containing polysiloxane are blended at the above-described proportion. By the subsequent heating, the silicone resin composition precursor is allowed to react with the hydroxyl group-containing polysiloxane. The solvent is distilled off as required.

In this way, the fourth silicone resin composition can be obtained.

The obtained fourth silicone resin composition is in a solid state. The fourth silicone resin composition in a solid state is obtained because the mobility of the alkenyl group-containing polysiloxane is reduced due to the steric hindrance of the cage octasilsesquioxane.

The fourth silicone resin composition exhibits the thermoplastic properties based on an increase in mobility of the cage octasilsesquioxane and the alkenyl group-containing polysiloxane by heating.

The thermoplastic temperature of the fourth silicone resin composition is, for example, 40 to 150° C., or preferably 50 to 100° C.

To be specific, the thermosetting properties of the once plasticized fourth silicone resin composition are exhibited by allowing the hydrosilyl group which remains in the fourth silicone resin composition precursor to react with the hydroxyl group in the hydroxyl group-containing polysiloxane.

To be more specific, the hydrosilyl group in the cage octasilsesquioxane in the fourth silicone resin composition precursor and the hydroxyl group in the hydroxyl group-containing polysiloxane are allowed to undergo the condensation reaction.

The thermosetting temperature of the fourth silicone resin composition is relatively low and is, for example, 100 to 250° C., or preferably 120 to 250° C. The thermosetting temperature is the temperature at which the fourth silicone resin composition shows the thermosetting properties. To be specific, the thermosetting temperature is the temperature at which the plasticized fourth silicone resin composition is cured by heating to be brought into a completely solid state.

The fourth silicone resin composition contains the hydroxyl group-containing polysiloxane, so that the hydroxyl group in the hydroxyl group-containing polysiloxane is allowed to react with the residual hydrosilyl group in the cage octasilsesquioxane and therefore, the cage octasilsesquioxane can be cross-linked. Thus, the flexibility of the fourth silicone resin composition can be improved.

The fourth silicone resin composition can lower its thermosetting temperature (for example, 100 to 250° C.).

The fifth silicone resin composition contains a cage octasilsesquioxane, an alkenyl group-containing polysiloxane, a hydrosilylation catalyst, and an organohydrogenpolysiloxane.

Each example of the cage octasilsesquioxane, the alkenyl group-containing polysiloxane, and the hydrosilylation catalyst in the fifth silicone resin composition includes the same cage octasilsesquioxane, the same alkenyl group-containing polysiloxane, and the same hydrosilylation catalyst as those illustrated in the fourth silicone resin composition, respectively. The content of the hydrosilyl group in the organohydrogenpolysiloxane is, for example, 0.01 to 20 mmol/g, or preferably 0.05 to 15 mmol/g.

An example of the organohydrogenpolysiloxane in the fifth silicone resin composition includes the same organohydrogenpolysiloxane as that illustrated in the second silicone resin composition.

The cage octasilsesquioxane, the alkenyl group-containing polysiloxane, the hydrosilylation catalyst, and the organohydrogenpolysiloxane are blended to prepare the fifth silicone resin composition.

The mixing ratio of the cage octasilsesquioxane with respect to the fifth silicone resin composition is, for example, 10 to 80 mass %, or preferably 10 to 70 mass %.

The mixing proportion of the alkenyl group-containing polysiloxane is adjusted so that the number of moles of the alkenyl group in the alkenyl group-containing polysiloxane is smaller than that of the hydrosilyl group in the cage octasilsesquioxane.

That is, the molar ratio (the number of moles of the alkenyl group/the number of moles of the hydrosilyl group) of the alkenyl group to the hydrosilyl group is below 1, for example, 0.10 to 0.99, preferably 0.20 to 0.99, or more preferably 0.50 to 0.99.

When the above-described molar ratio exceeds the above-described range, the hydrosilyl group is fewer than the alkenyl group. In such a case, the excess of the hydrosilyl group does not sufficiently remain after the reaction and the thermosetting properties may not be imparted to the fifth silicone resin composition.

On the other hand, when the above-described molar ratio is below the above-described range, the hydrosilyl group excessively remains and the cage octasilsesquioxanes themselves undergo hydrolysis by moisture in the air and a self-condensation reaction to be cured, so that flexibility may not be obtained.

The mixing ratio of the hydrosilylation catalyst (solid content) with respect to 100 parts by mass of the total amount of the cage octasilsesquioxane and the alkenyl group-containing polysiloxane is, for example, $1.0 \times 10^{-10}$ to 3 parts by mass, or preferably $1.0 \times 10^{-8}$ to 1 parts by mass.

The mixing ratio of the organohydrogenpolysiloxane is adjusted so that the number of moles (X) of the hydrosilyl group with respect to the number of moles (Y), which is obtained by subtracting the number of moles of the alkenyl group in the alkenyl group-containing polysiloxane from the number of moles of the hydrosilyl group in the cage octasilsesquioxane, as the molar ratio (X/Y), is, for example, 0.001 to 1000, or preferably 0.01 to 100. In other words, the mixing ratio of the organohydrogenpolysiloxane with respect to 100 parts by mass of the total amount of the cage octasilsesquioxane and the alkenyl group-containing polysiloxane is, for example, 0.01 to 100 parts by mass, or preferably 0.01 to 50 parts by mass.

The mixing ratio of the organohydrogenpolysiloxane with respect to the fifth silicone resin composition as a whole is, for example, 0.01 to 50 mass %, or preferably 0.01 to 30 mass %.

In order to prepare the fifth silicone resin composition, preferably, a silicone resin composition precursor, which is obtained by allowing the cage octasilsesquioxane to react with the alkenyl group-containing polysiloxane in the presence of the hydrosilylation catalyst, and the organohydrogenpolysiloxane are blended.

That is, first, the cage octasilsesquioxane is allowed to react with the alkenyl group-containing polysiloxane in the presence of the hydrosilylation catalyst at such a mixing ratio that the number of moles of the hydrosilyl group in the cage octasilsesquioxane is larger (excessive) than that of the alkenyl group in the alkenyl group-containing polysiloxane. In this way, the silicone resin composition precursor is obtained.

To be more specific, in order to obtain the silicone resin composition precursor, the above-described cage octasilsesquioxane and the above-described alkenyl group-containing polysiloxane are blended at the above-described mixing proportion, along with the hydrosilylation catalyst, and the solvent as required, and thereafter, the mixture is heated as required.

Examples of the solvent include an aromatic hydrocarbon such as toluene, an aliphatic hydrocarbon such as hexane, and ester such as ethyl acetate. Preferably, in view of improving compatibility of each of the components, an aromatic hydrocarbon is used, or more preferably, toluene is used.

The reaction temperature is, for example, 0 to 100° C., or preferably 20 to 80° C. and the reaction duration is, for example, 0.5 to 96 hours.

In this way, the cage octasilsesquioxane is allowed to react with the alkenyl group-containing polysiloxane. That is, the hydrosilyl group in the cage octasilsesquioxane and the alkenyl group in the alkenyl group-containing polysiloxane are allowed to undergo the hydrosilylation reaction.

The degree of the hydrosilylation reaction of the hydrosilyl group in the cage octasilsesquioxane with the alkenyl group in the alkenyl group-containing polysiloxane can be checked by $^1$H-NMR measurement based on the intensity of a signal derived from the alkenyl group in the alkenyl group-containing polysiloxane. The hydrosilylation reaction is considered to be terminated at the time of disappearance of the signal.

In the above-described hydrosilylation reaction, the cage octasilsesquioxane is allowed to react with the alkenyl group-containing polysiloxane so that the number of moles of the hydrosilyl group is excessive compared with the number of moles of the alkenyl group. After the reaction, the excess of the hydrosilyl group remains.

In this way, the silicone resin composition precursor is obtained.

The silicone resin composition precursor is in a liquid state or in a semi-solid state.

Next, the obtained silicone resin composition precursor and organohydrogenpolysiloxane are blended at the above-described proportion. By the subsequent heating (described later), the silicone resin composition precursor is allowed to react with the organohydrogenpolysiloxane. The solvent is distilled off as required.

In this way, the fifth silicone resin composition can be obtained.

The obtained fifth silicone resin composition is in a solid state. The fifth silicone resin composition in a solid state is obtained because the mobility of the alkenyl group-containing polysiloxane is reduced due to the steric hindrance of the cage octasilsesquioxane.

In the fifth silicone resin composition, the molar ratio of the monovalent hydrocarbon group: hydrogen in $R^{12}$ is within a specific range and therefore, in the cage octasilsesquioxane, the proportion of the hydrosilyl group to be reacted with the alkenyl group in the alkenyl group-containing polysiloxane is adjusted. Furthermore, the alkenyl group-containing polysiloxane is allowed to react with the cage octasilsesquioxane so that the alkenyl group thereof has the number of moles that is smaller than the number of moles of the hydrosilyl group in the cage octasilsesquioxane. Therefore, the obtained fifth silicone resin composition can have both the thermoplastic and thermosetting properties, while having an excellent transparency and heat resistance.

That is, the fifth silicone resin composition is once plasticized (or liquefied) by the above-described heating and then, is cured by heating.

The fifth silicone resin composition exhibits the thermoplastic properties based on an increase in mobility of the cage octasilsesquioxane and the alkenyl group-containing polysiloxane by heating.

The thermoplastic temperature of the fifth silicone resin composition is, for example, 40 to 150° C., or preferably 50 to 100° C. The thermoplastic temperature is the temperature at which the fifth silicone resin composition shows the thermoplastic properties. To be specific, the thermoplastic temperature is the temperature at which the fifth silicone resin composition in a solid state is softened by heating to be brought into a completely liquid state and is substantially the same as the softening temperature.

To be specific, the thermosetting properties of the once plasticized fifth silicone resin composition are exhibited by allowing the hydrosilyl group which remains in the silicone resin composition precursor to react with the hydrosilyl group in the organohydrogenpolysiloxane.

To be more specific, the hydrosilyl group in the cage octasilsesquioxane in the silicone resin composition precursor and the hydrosilyl group in the organohydrogenpolysiloxane are allowed to react with moisture in the air (to be hydrolyzed) and undergo a dehydration (intermolecular dehydration) condensation reaction.

The thermosetting temperature of the fifth silicone resin composition is relatively low and is, for example, 100 to 250° C., or preferably 120 to 250° C. The thermosetting temperature is the temperature at which the fifth silicone resin composition shows thermosetting properties. To be specific, the thermosetting temperature is the temperature at which the plasticized fifth silicone resin composition is cured by heating to be brought into a completely solid state.

In the fifth silicone resin composition, the hydrosilyl group in the organohydrogenpolysiloxane is allowed to react with the residual hydrosilyl group in the cage octasilsesquioxane. That is, by the dehydration (intermolecular dehydration) condensation reaction, the cage octasilsesquioxane can be cross-linked. Thus, the flexibility of the fifth silicone resin composition can be improved.

The fifth silicone resin composition can lower its thermosetting temperature (for example, 100 to 250° C.).

The sixth silicone resin composition contains a cage octasilsesquioxane, a polysiloxane containing alkenyl groups at both ends, a hydrosilylation catalyst, and a polysiloxane containing alkenyl groups in its side chain.

Each example of the cage octasilsesquioxane, the polysiloxane containing alkenyl groups at both ends, and the hydrosilylation catalyst in the sixth silicone resin composition includes the same cage octasilsesquioxane as that illustrated in the third silicone resin composition, the same polysiloxane containing alkenyl groups at both ends as that illustrated in the third silicone resin composition, and the same hydrosilylation catalyst as that illustrated in the second silicone resin composition, respectively.

The polysiloxane containing alkenyl groups in its side chain is a polysiloxane containing two or more alkenyl groups in its side chain. Examples of the polysiloxane containing alkenyl groups in its side chain include a straight chain siloxane-containing polysiloxane, which contains alkenyl groups as a side chain bonded to a main chain (a silicon atom of the main chain) containing a straight chain siloxane portion (—Si—O—), and/or, a branched chain siloxane-containing polysiloxane, which contains alkenyl groups bonded to the silicon atom of the branched chain siloxane portion.

To be specific, the straight chain siloxane-containing polysiloxane is represented by the following formula (14).

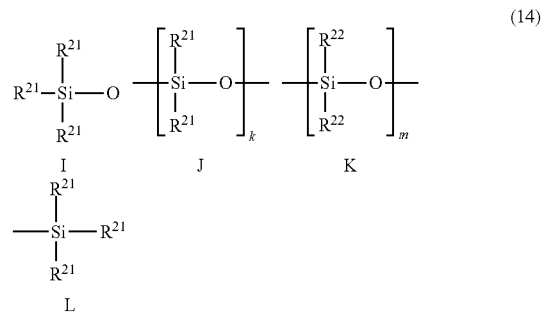

(where, in formula, I to L represent a constituent unit, I and L represent an end unit, and J and K represent a repeating unit. $R^{21}$ represents a monovalent hydrocarbon group and $R^{22}$ represents an alkenyl group. "k" represents an integer of 0 or 1 or more and "m" represents an integer of 2 or more.)

I to L constitute the straight chain siloxane-containing polysiloxane.

The monovalent hydrocarbon groups represented by $R^{21}$ in formula (14) may be the same or different from each other. Preferably, the monovalent hydrocarbon groups represented by $R^{21}$ are the same.

An example of the monovalent hydrocarbon group represented by $R^{21}$ includes the same monovalent hydrocarbon group as that represented by $R^{11}$ in the above-described formula (5). As the monovalent hydrocarbon group represented by $R^{21}$, preferably, methyl and phenyl are used, or more preferably, methyl is used.

"k" represents, in view of reactivity and stability, preferably an integer of 1 to 10000, or more preferably an integer of 1 to 5000.

"m" represents, in view of reactivity and stability, preferably an integer of 2 to 500, or more preferably an integer of 2 to 100.

The number average molecular weight of the straight chain siloxane-containing polysiloxane is, in view of stability and handling ability, for example, 200 to 1000000, or preferably 200 to 80000.

The content of the vinyl group in the straight chain siloxane-containing polysiloxane is, for example, 0.01 to 10 mmol/g, or preferably 0.1 to 5 mmol/g. The content of the vinyl group in the straight chain siloxane-containing polysiloxane is measured from the area ratio of the vinyl group to the methyl group with a $^1$H-NMR.

The straight chain siloxane-containing polysiloxane can be, for example, synthesized in accordance with a known method. A commercially available product (for example, manufactured by Gelest, Inc.) can be also used.

To be specific, the branched chain siloxane-containing polysiloxane is represented by the following formula (15).

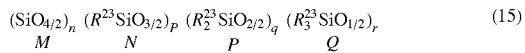

(where, in formula, M, N, P, and Q represent a constituent unit, M, N, and P represent a repeating unit, and Q represents an end unit. $R^{23}$ represents a monovalent hydrocarbon group. "n" represents an integer of 1 or more, "p" and "q" represent an integer of 0 or 1 or more, and "r" represents an integer of 4 or more. In addition, per one molecule, at least one $R^{23}$ is an alkenyl group.)

M, N, P, and Q constitute the branched chain siloxane-containing polysiloxane.

Examples of the monovalent hydrocarbon group represented by $R^{23}$ include a saturated hydrocarbon group, an aromatic hydrocarbon group, and an unsaturated hydrocarbon group (excluding the aromatic hydrocarbon group).

An example of the saturated hydrocarbon group and the aromatic hydrocarbon group includes the same monovalent hydrocarbon group as that represented by $R^{11}$ in the above-described formula (5). Preferably, methyl and phenyl are used, or more preferably, methyl is used.

An example of the unsaturated hydrocarbon group (excluding the aromatic hydrocarbon group) includes the same alkenyl group as that represented by $R^{12}$ in the above-described formula (5). Preferably, vinyl is used.

The monovalent hydrocarbon group represented by $R^{23}$ in formula (15) contains at least the alkenyl group, preferably an alkyl group and/or a phenyl group, and the alkenyl group, or more preferably a methyl group and a vinyl group.

The number of the alkenyl group in the branched chain siloxane-containing polysiloxane is 1 or more, preferably 3 or more, and is usually 30 or less.

"n" represents, preferably an integer of 1 to 100, or more preferably an integer of 1 to 50.

"p" represents, preferably an integer of 1 to 100, or more preferably an integer of 1 to 50.

"q" represents, preferably an integer of 1 to 100, or more preferably an integer of 1 to 50.

"r" represents, preferably an integer of 1 to 100, or more preferably an integer of 1 to 30.

The number average molecular weight of the branched chain siloxane-containing polysiloxane is, in view of stability and handling ability, for example, 100 to 10000, or preferably 200 to 8000.

The content of the vinyl group in the branched chain siloxane-containing polysiloxane is, for example, 0.01 to 100 mmol/g, or preferably 0.1 to 10 mmol/g. The content of the vinyl group in the branched chain siloxane-containing polysiloxane is measured from the area ratio of the vinyl group to the methyl group with a $^1$H-NMR.

The branched chain siloxane-containing polysiloxane can be, for example, synthesized in accordance with a known method. A commercially available product (for example, manufactured by Gelest, Inc.) can be also used.

The cage octasilsesquioxane, the polysiloxane containing alkenyl groups at both ends, the hydrosilylation catalyst, and the polysiloxane containing alkenyl groups in its side chain are blended, so that the sixth silicone resin composition is prepared.

The mixing ratio of the cage octasilsesquioxane with respect to the sixth silicone resin composition is, for example, 10 to 80 mass %, or preferably 10 to 70 mass %.

The mixing proportion of the polysiloxane containing alkenyl groups at both ends is adjusted so that the number of moles of the alkenyl group in the polysiloxane containing alkenyl groups at both ends is smaller than that of the hydrosilyl group in the cage octasilsesquioxane.

That is, the molar ratio (the number of moles of the alkenyl group/the number of moles of the hydrosilyl group) of the alkenyl group to the hydrosilyl group is below 1, for example, 0.10 to 0.99, preferably 0.20 to 0.99, or more preferably 0.50 to 0.99. In other words, the mixing ratio of the polysiloxane containing alkenyl groups at both ends with respect to 100 parts by mass of the total amount of the cage octasilsesqui-oxane and the polysiloxane containing alkenyl groups at both ends is, for example, 0.001 to 30 parts by mass, or preferably 0.01 to 20 parts by mass. Also, the mixing ratio of the polysiloxane containing alkenyl groups at both ends with respect to 100 parts by mass of the total amount of the cage octasilsesquioxane and the polysiloxane containing alkenyl groups at both ends can be set to be, for example, 0.01 to 100 parts by mass, or preferably 0.1 to 50 parts by mass.

When the above-described molar ratio exceeds the above-described range, the hydrosilyl group is fewer than the alkenyl group. In such a case, the excess of the hydrosilyl group does not sufficiently remain after the reaction and the thermosetting properties may not be imparted to the sixth silicone resin composition.

On the other hand, when the above-described molar ratio is below the above-described range, the hydrosilyl group excessively remains and the cage octasilsesquioxanes themselves undergo hydrolysis by moisture in the air and a self-condensation reaction to be cured, so that flexibility may not be obtained.

The mixing ratio of the hydrosilylation catalyst (solid content) with respect to 100 parts by mass of the total amount of the cage octasilsesquioxane and the polysiloxane containing alkenyl groups at both ends is, for example, $1.0 \times 10^{-10}$ to 3 parts by mass, or preferably $1.0 \times 10^{-8}$ to 1 parts by mass.

The mixing ratio of the polysiloxane containing alkenyl groups in its side chain is adjusted so that the number of moles (X) of the alkenyl group with respect to the number of moles (Y), which is obtained by subtracting the number of moles of the alkenyl group in the polysiloxane containing alkenyl groups at both ends from the number of moles of the hydrosilyl group in the cage octasilsesquioxane, as the molar ratio (X/Y), is, for example, 0.001 to 1000, or preferably 0.01 to 100.

In order to prepare the sixth silicone resin composition, preferably, a sixth silicone resin composition precursor, which is obtained by allowing the cage octasilsesquioxane to react with the polysiloxane containing alkenyl groups at both ends in the presence of the hydrosilylation catalyst, and the polysiloxane containing alkenyl groups in its side chain are blended.

That is, first, the cage octasilsesquioxane is allowed to react with the polysiloxane containing alkenyl groups at both ends in the presence of the hydrosilylation catalyst at such a mixing proportion that the number of moles of the hydrosilyl group in the cage octasilsesquioxane is larger (excessive) than that of the alkenyl group in the polysiloxane containing alkenyl groups at both ends. In this way, the sixth silicone resin composition precursor is obtained.

To be more specific, in order to obtain the sixth silicone resin composition precursor, the above-described cage octasilsesquioxane and the above-described polysiloxane containing alkenyl groups at both ends are blended at the above-described mixing proportion, along with the hydrosilylation catalyst, and the solvent as required, and thereafter, the mixture is heated as required.

Examples of the solvent include an aromatic hydrocarbon such as toluene, an aliphatic hydrocarbon such as hexane, and ester such as ethyl acetate. Preferably, in view of improving compatibility of each of the components, an aromatic hydrocarbon is used, or more preferably, toluene is used.

The reaction temperature is, for example, 0 to 100° C., or preferably 20 to 80° C. and the reaction duration is, for example, 0.5 to 96 hours.

In this way, the cage octasilsesquioxane is allowed to react with the polysiloxane containing alkenyl groups at both ends. That is, the hydrosilyl group in the cage octasilsesquioxane and the alkenyl group in the polysiloxane containing alkenyl groups at both ends are allowed to undergo the hydrosilylation reaction.

The degree of the hydrosilylation reaction of the hydrosilyl group in the cage octasilsesquioxane with the alkenyl group in the polysiloxane containing alkenyl groups at both ends can be checked by $^1$H-NMR measurement based on the intensity of a signal derived from the alkenyl group in the polysiloxane containing alkenyl groups at both ends. The hydrosilylation reaction is considered to be terminated at the time of disappearance of the signal.

In the above-described hydrosilylation reaction, the cage octasilsesquioxane is allowed to react with the polysiloxane containing alkenyl groups at both ends so that the number of moles of the hydrosilyl group is excessive compared with the number of moles of the alkenyl group. After the reaction, the excess of the hydrosilyl group remains.

In this way, the sixth silicone resin composition precursor is obtained.

The sixth silicone resin composition precursor is in a liquid state or in a semi-solid state.

Next, the obtained sixth silicone resin composition precursor and the polysiloxane containing alkenyl groups in its side chain are blended at the above-described proportion. By the subsequent heating (described later), the sixth silicone resin composition precursor is allowed to react with the polysiloxane containing alkenyl groups in its side chain. The solvent is distilled off as required.

In this way, the sixth silicone resin composition can be obtained.

The obtained sixth silicone resin composition is in a solid state. The sixth silicone resin composition in a solid state is obtained because the mobility of the polysiloxane containing alkenyl groups at both ends is reduced due to the steric hindrance of the cage octasilsesquioxane.

In the sixth silicone resin composition, the molar ratio of the monovalent hydrocarbon group: hydrogen in the cage octasilsesquioxane is within a specific range and therefore, in the cage octasilsesquioxane, the proportion of the hydrosilyl group to be reacted with the alkenyl group in the polysiloxane containing alkenyl groups at both ends is adjusted. Furthermore, the polysiloxane containing alkenyl groups at both ends is allowed to react with the cage octasilsesquioxane so that the alkenyl group thereof has the number of moles that is smaller than the number of moles of the hydrosilyl group in the cage octasilsesquioxane. Therefore, the obtained sixth silicone resin composition can have both the thermoplastic and thermosetting properties, while having an excellent transparency and heat resistance.

That is, the sixth silicone resin composition is once plasticized (or liquefied) by the above-described heating and then, is cured by heating.

The sixth silicone resin composition exhibits the thermoplastic properties based on an increase in mobility of the cage octasilsesquioxane and the polysiloxane containing alkenyl groups at both ends by heating.

The thermoplastic temperature of the sixth silicone resin composition is, for example, 40 to 150° C., or preferably 50 to 100° C. The thermoplastic temperature is the temperature at which the sixth silicone resin composition shows the thermoplastic properties. To be specific, the thermoplastic temperature is the temperature at which the sixth silicone resin composition in a solid state is softened by heating to be brought into a completely liquid state and is substantially the same as the softening temperature.

To be specific, the thermosetting properties of the once plasticized sixth silicone resin composition are exhibited by allowing the hydrosilyl group which remains in the sixth silicone resin composition precursor to react with the alkenyl group in the polysiloxane containing alkenyl groups in its side chain.

To be more specific, the hydrosilyl group in the cage octasilsesquioxane in the sixth silicone resin composition precursor and the alkenyl group in the polysiloxane containing alkenyl groups in its side chain are allowed to undergo the hydrosilylation reaction.

The thermosetting temperature of the sixth silicone resin composition is relatively low and is, for example, 100 to 250° C., or preferably 120 to 250° C. The thermosetting temperature is the temperature at which the sixth silicone resin composition shows the thermosetting properties. To be specific, the thermosetting temperature is the temperature at which the plasticized sixth silicone resin composition is cured by heating to be brought into a completely solid state.

In the sixth silicone resin composition, the alkenyl group in the polysiloxane containing alkenyl groups in its side chain is allowed to react with the residual hydrosilyl group in the cage octasilsesquioxane and therefore, the cage octasilsesquioxane can be cross-linked. Thus, the flexibility of the sixth silicone resin composition can be improved.

The sixth silicone resin composition can lower its thermosetting temperature (for example, 100 to 250° C.).

The silicone microparticles are microparticles of the polysiloxane (after curing) having a cross-linked structure. An example thereof includes polysilsesquioxane microparticles. In view of hardness (reinforcing effect of the encapsulating layer), preferably, polymethylsilsesquioxane microparticles are used.

The refractive index of the silicone microparticles is similar to that of the encapsulating resin (the encapsulating resin layer after curing (the encapsulating layer)). To be specific, the refractive index of the silicone microparticles is, for example, 1.39 to 1.43, or preferably 1.40 to 1.42.

The difference between the refractive index of the silicone microparticles and the refractive index of the encapsulating resin (the encapsulating resin layer after curing (the encapsulating layer)) is, for example, within 0.03, preferably within 0.02, or more preferably within 0.01 in absolute value.

The silicone microparticles are contained in the encapsulating resin composition so that the hardness of the encapsulating layer is improved and the backscattering in the encapsulating sheet is prevented to thus suppress a brightness loss (described later) of an LED device (described later) and to improve the brightness of the LED device (described later).

The average particle size (the average of the maximum length) of each of the silicone microparticles is, for example, 0.2 to 40 µm, or preferably 0.5 to 10 µm.

When the average particle size of the silicone microparticles is below the above-described range, an increase in viscosity and application properties may be insufficient.

The average particle size of the silicone microparticles is measured with a particle size distribution analyzer.

The mixing ratio of the silicone microparticles with respect to the encapsulating resin composition is, for example, 20 to 50 mass %, or preferably 30 to 50 mass %.

When the mixing proportion of the silicone microparticles is below the above-described lower limit, the inhibiting effect on bleeding may be insufficient. On the other hand, when the mixing proportion of the silicone microparticles exceeds the above-described upper limit, the formability or the processability may be insufficient.

A phosphor can be contained in the encapsulating resin composition as required.

The phosphor is a particle having a wavelength conversion function. The phosphor is not particularly limited as long as it is a known phosphor used in an optical semiconductor element device. An example of the phosphor includes a known phosphor such as a yellow phosphor which is capable of converting blue light into yellow light and a red phosphor which is capable of converting the blue light into red light.

Examples of the yellow phosphor include a garnet type phosphor having a garnet type crystal structure such as $Y_3Al_5O_{12}$:Ce (YAG (yttrium aluminum garnet):Ce) and $Tb_3Al_3O_{12}$:Ce (TAG (terbium aluminum garnet):Ce) and an oxynitride phosphor such as Ca-α-SiAlON.

An example of the red phosphor includes a nitride phosphor such as $CaAlSiN_3$:Eu and $CaSiN_2$:Eu.

Of the phosphors, preferably, a yellow phosphor is used, more preferably, Ca-α-SiAlON and YAG:Ce are used, or particularly preferably, YAG:Ce is used.

The phosphors can be used alone or in combination.

The phosphor is in the form of a particle. The shape thereof is not particularly limited and examples of the shape thereof include a generally sphere shape, a generally flat plate shape, and a generally needle shape.

The average particle size (the average of the maximum length) of the phosphor is, for example, 0.1 to 500 μm, or preferably 0.2 to 200 μm. The average particle size of the phosphor particles is measured with a particle size distribution analyzer.

The mixing proportion of the phosphor is appropriately adjusted so that the encapsulating resin composition becomes white corresponding to a light emitting diode 11, a board 14, and an LED device 2. The mixing ratio of the phosphor with respect to the encapsulating resin composition is, for example, 3 to 80 mass %, or preferably 4 to 60 mass %.

A known additive can be added to the above-described encapsulating resin composition at an appropriate proportion as required. Examples of the known additive include silane coupling agents, antioxidants, modifiers, surfactants, dyes, pigments, discoloration inhibitors, and ultraviolet absorbers.

In order to prepare the encapsulating resin composition, the encapsulating resin, the silicone microparticles, the phosphor as required, and the additive as required are blended at the above-described mixing proportion to be mixed.

The mixing conditions are as follows: a temperature of, for example, 10 to 40° C., or preferably 15 to 35° C. and a duration of, for example, 10 minutes or more, or preferably 30 minutes or more.

The encapsulating resin composition is subjected to a defoaming process as required after the preparation thereof.

An example of the defoaming method includes a known defoaming method such as reduced pressure defoaming (vacuum defoaming), centrifugal defoaming, and ultrasonic defoaming. Preferably, reduced pressure defoaming (vacuum defoaming) is used.

When the defoaming method is the reduced pressure defoaming (vacuum defoaming), the defoaming conditions are as follows: a temperature of, for example, 10 to 40° C., or preferably 15 to 35° C. and a duration of, for example, 10 minutes or more, or preferably 30 minutes or more.

The viscosity of the encapsulating resin composition at 25° C. is, for example, 1 to 190 Pa·s, or preferably 2 to 170 Pa·s.

When the viscosity of the encapsulating resin composition is below the above-described lower limit, the formability or the processability may be insufficient. On the other hand, when the viscosity of the encapsulating resin composition exceeds the above-described upper limit, before the silicone resin composition is laminated to be formed into a sheet shape, a foam is not removed in a defoaming process of the silicone resin composition (a coating liquid) by stirring or the like and the foam enters the LED device 2, so that a color deviation of the LED device 2 or a defect in a reliability test may occur.

When the encapsulating resin layer is formed from an encapsulating resin composition containing a thermosetting resin (preferably, a silicone resin), preferably, the encapsulating resin layer is formed from an encapsulating resin composition in a semi-cured (in a B-stage) state.

The compressive elastic modulus (at 25° C.) of the encapsulating resin layer (the encapsulating resin layer in a semi-cured state) is, for example, in view of encapsulating characteristics and handling ability, 0.01 MPa or more, or preferably 0.04 to 0.1 MPa.

When the compressive elastic modulus of the encapsulating resin layer is below the above-described lower limit, there may be a case where the shape retention of the encapsulating resin layer is reduced. In addition, when the compressive elastic modulus of the encapsulating resin layer at 25° C. is within the above-described range, damage of a wire (described later) and a light emitting diode (described later) can be prevented, while the light emitting diode can be surely embedded.

The compressive elastic modulus of the encapsulating resin layer can be obtained by a compression test using a precision load measuring device.

In the measurement of the compressive elastic modulus of the encapsulating resin layer, when the encapsulating resin layer is laminated on a release sheet to be described later, the encapsulating resin layer is served with the release sheet. The compressive elastic modulus of the encapsulating resin layer is measured at the encapsulating resin layer side. In such a case, the compressive elastic modulus of the release sheet is significantly high, which is, for example, 11 MPa or more, so that it is not counted. The compressive elastic modulus of a laminate of the release sheet and the encapsulating resin layer is substantially calculated as the compressive elastic modulus of the encapsulating resin layer.

The thickness of the encapsulating resin layer is not particularly limited and is appropriately adjusted so that the light emitting diode and the wire can be embedded at the time of encapsulating the light emitting diode to be described later.

The thickness of the encapsulating resin layer is, for example, 300 to 3000 μm, or preferably 500 to 2000 μm.

When the thickness of the encapsulating resin layer is below the above-described range, the encapsulation of the light emitting diode may be insufficient.

The encapsulating resin layer can be formed of a single layer or a plurality of layers.

Next, a method for producing an encapsulating sheet 1 is described with reference to FIGS. 1(a) and 1(b).

In this method, first, as shown in FIG. 1(a), a release sheet 5 is prepared.

The release sheet 5 is used as a protecting sheet which covers and protects the top surface of an encapsulating resin layer 7 and as a coating substrate of the encapsulating resin layer 7.

Examples of the release sheet 5, though not particularly limited, include a polyester film such as a polyethylene terephthalate (PET) film; a polycarbonate film; a polyolefin film such as a polyethylene film and a polypropylene film; a polystyrene film; an acrylic film; and a resin film such as a silicone resin film and a fluorine resin film.

Of the release sheets 5, preferably, a polyester film is used.

A release treatment is performed on the top surface (the surface at the side where the encapsulating resin layer 7 is to be formed) of the release sheet 5 as required so as to increase the release characteristics from the encapsulating resin layer 7.

The thickness of the release sheet 5 is not particularly limited and is, for example, in view of handling ability and cost, 20 to 100 μm, or preferably 30 to 80 μm.

Figure 1B:
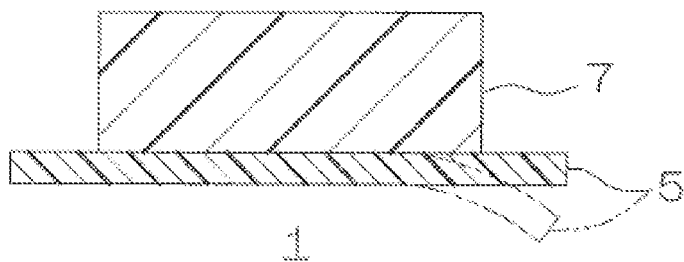

Next, as shown in FIG. 1(b), the encapsulating resin layer 7 is laminated on the upper surface of the release sheet 5.

In order to laminate the encapsulating resin layer 7 on the release sheet 5, for example, the encapsulating resin composition is applied to the entire upper surface of the release sheet 5 by a known application method such as a casting, a spin coating, and a roll coating, so that the encapsulating resin layer 7 is formed.

When the encapsulating resin composition contains the thermosetting resin, the encapsulating resin layer 7 is heated, so that the encapsulating resin layer 7 made from the encapsulating resin composition is semi-cured.

The heating conditions are as follows: a temperature of, for example, 100 to 150° C., or preferably 120 to 140° C. and a heating duration of, for example, 1 to 100 minutes, or preferably 5 to 15 minutes.

In this way, the encapsulating resin layer 7 is laminated on the upper surface of the release sheet 5.

As described above, the encapsulating sheet 1 is prepared.

The light transmittance of the encapsulating resin layer 7 with respect to the visible light in the wavelength of 400 nm to 700 nm is, in the case where it does not contain a phosphor and has a thickness of 500 pm, for example, 80% or more, preferably 90% or more, or more preferably 95% or more, and is, for example, 100% or less.

When the light transmittance of the encapsulating resin layer 7 with respect to the visible light in the wavelength of 400 nm to 700 nm is below the above-described range, a brightness loss may not be sufficiently suppressed.

The light transmittance of the encapsulating resin layer 7 is measured with a spectrophotometer.

The light transmittance of the encapsulating resin layer 7 cannot be accurately measured in a state where the encapsulating resin composition contains a phosphor due to a large influence of the phosphor, so that it is measured in a state where the encapsulating resin composition does not contain the phosphor.

The haze value of the encapsulating resin layer 7 is, in the case where the phosphor is not contained and the thickness of the encapsulating resin layer 7 is 500 μm, for example, 20 or less, or preferably 10 or less.

When the haze value of the encapsulating resin layer 7 is below the above-described range, a brightness loss may not be sufficiently suppressed.

The haze value of the encapsulating resin layer 7 is measured with a haze meter.

The haze value of the encapsulating resin layer 7 is measured in a state where the phosphor is not contained.

The size of the encapsulating sheet 1 is not particularly limited as long as the encapsulating sheet 1 is capable of encapsulating the light emitting diode (described later) and the wire (described later). The size of the encapsulating sheet 1 is larger by, for example, 1 to 20 mm, or preferably 2 to 10 mm than the outer circumference line of the projected surface in the up-down direction of the light emitting diode and the wire (described later). When a plurality of the light emitting diodes and a plurality of the wires are collectively encapsulated, the size of the encapsulating sheet 1 is larger by, for example, 1 to 20 mm, or preferably 2 to 10 mm than the outer circumference line of the projected surface in the up-down direction of the light emitting diode and the wire, each of which is located at the most outer side.

When the size of the encapsulating sheet 1 is below the above-described lower limit, there may be a case where blue light emitted from the light emitting diode (described later) is not sufficiently converted to yellow light, so that white characteristics of white light are reduced. When the size of the encapsulating sheet 1 exceeds the above-described upper limit, there may be a case where angle dependence of color tone is poor and the cost is increased.

The above-described encapsulating sheet 1 is formed into a generally rectangular shape. However, the shape of the encapsulating sheet 1 is not particularly limited to this and can be appropriately changed according to its necessity. To be specific, the shape thereof can be formed into a generally cylindrical column shape, a generally tapered cylindrical column shape (a shape in which the diameter is gradually reduced toward the upper side), or the like.

Next, a method for producing the LED device 2 by encapsulating the light emitting diode 11 using the encapsulating sheet 1 in FIG. 1(b) is described with reference to FIGS. 2(a)-2(d).

Figure 2A:
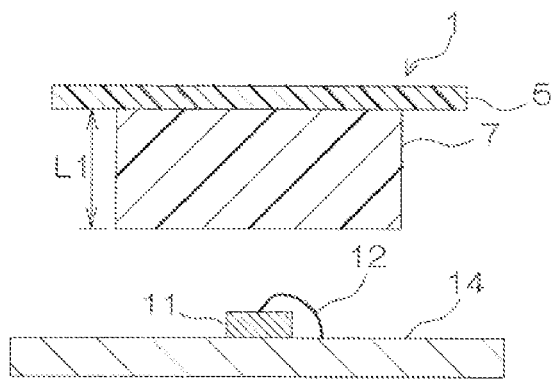
FIGS. 2(a)-2(d) show process drawings for illustrating the steps of fabricating an optical semiconductor element device by encapsulating an optical semiconductor element by one embodiment of the encapsulating sheet of the present invention:
  2(a) illustrating a step of disposing an encapsulating sheet at the upper side of a board,
  2(b) illustrating a step of embedding a light emitting diode by the encapsulating sheet,
  2(c) illustrating a step of compressively bonding the encapsulating sheet to the board to encapsulate the optical semiconductor element, and
  2(d) illustrating a step of heating the encapsulating sheet to be cured.

In this method, first, as shown in FIG. 2(a), the encapsulating sheet 1 and the board 14 are prepared.

The board 14 is formed of, for example, a metal board made of aluminum or the like or, for example, a resin board made of a polyimide resin or the like. The board 14 is formed into a generally flat plate shape which is larger than the encapsulating resin layer 7 in the encapsulating sheet 1.

The board 14 is provided with a terminal (not shown) formed on the upper surface thereof, the light emitting diode 11 mounted on the central portion thereof, and a wire 12 for electrically connecting the light emitting diode 11 to the terminal (not shown). The upper surface of the light emitting diode 11 is wire bonded to the upper surface of the board 14 via the wire 12.

The wire 12 is formed of a conductive material such as gold, silver, or copper.

The wire 12 is formed into a curved shape in side view and the size thereof is appropriately selected. The wire diameter thereof is, for example, 10 to 100 μm. The length in the up-down direction between the element-side contact point of the wire 12 on the upper surface of the light emitting diode 11 and the most upper portion of the wire 12 is, for example, 150 to 250 μm. The length in the up-down direction between the board-side contact point of the wire 12 on the upper surface of the board 14 and the most upper portion of the wire 12 is, for example, 300 to 450 μm. The length in the plane direction (the length in the right-left direction in FIG. 2(a)) between the element-side contact point and the board-side contact point is, for example, 500 to 1600 μm.

The light emitting diode 11 is, for example, an optical semiconductor element capable of emitting the blue light and is formed into a generally rectangular shape in sectional view.

The light emitting diode 11 is formed into a generally rectangular flat plate shape in plane view. The length of the side thereof is, for example, 0.1 to 5 mm and the thickness thereof is, for example, 10 to 1000 μm.

The encapsulating sheet 1 in a state shown in FIG. 1(b) is reversed up-side down and the reversed encapsulating sheet 1 is disposed so that the encapsulating resin layer 7 is opposed to the light emitting diode 11 at spaced intervals thereto in the up-down direction.

Figure 2B:
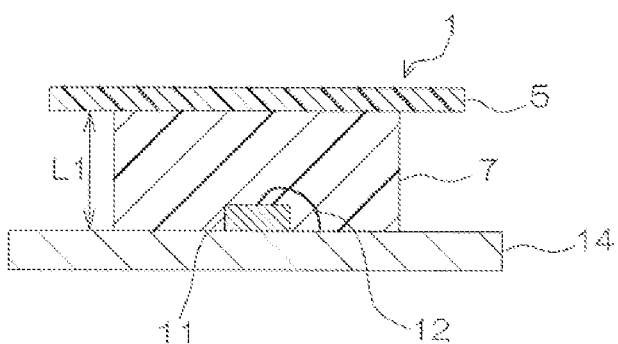
Figure 2C:
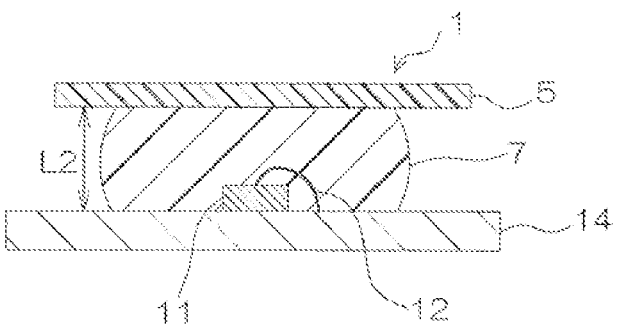

Next, as shown in FIGS. 2(b) and 2(c), the light emitting diode 11 is embedded by the encapsulating sheet 1.

To be specific, as shown in FIG. 2(b), the encapsulating sheet 1 is lowered (pressed downwardly) and the surfaces of the light emitting diode 11 and the wire 12 are covered with the encapsulating resin layer 7. Subsequently, as shown in FIG. 2(c), the encapsulating sheet 1 is compressively bonded to the board 14.

The compressive bonding is performed by controlling the amount (hereinafter, defined as a pushed-in amount) in which the encapsulating resin layer 7 is pushed into (compressed into) the board 14 side.

The pushed-in amount is represented by the following formula.

Pushed-in amount=Thickness $L1$ of the encapsulating resin layer 7 before the compression (the compressive bonding)−Thickness $L2$ of the encapsulating resin layer 7 after the compression (the compressive bonding)

The pushed-in amount is adjusted so that the pushed-in rate represented by the following formula is set to be, for example, 5 to 30%.

Pushed-in rate=Pushed-in amount/Thickness $L1$ of the encapsulating resin layer 7 before the compression (the compressive bonding)×100%

To be specific, the encapsulating sheet 1 is compressively bonded so that the thickness of the encapsulating resin layer 7 is compressed by the pushed-in amount.

By adjusting the pushed-in amount in this way, a collapse of the encapsulating sheet 1 is prevented, so that the light emitting diode 11 can be surely encapsulated by the encapsulating sheet 1.

The temperature of the compressive bonding is, for example, 0 to 40° C., or preferably 15 to 35° C.

In the compressive bonding, the encapsulating sheet 1 can be retained in a state where it is pressed downwardly (pushed in) and the retention duration thereof is, for example, 10 seconds to 10 minutes, or preferably 10 seconds to 5 minutes.

Figure 2D:
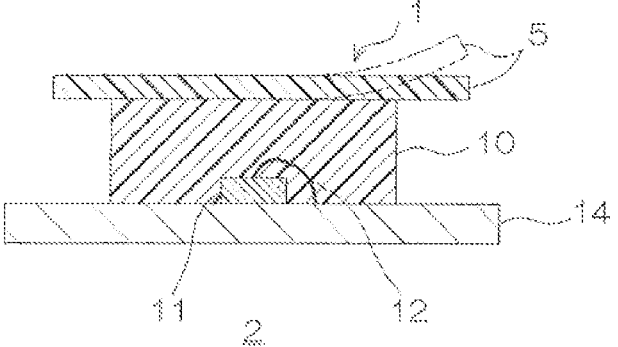

Next, as shown in FIG. 2(d), when the encapsulating resin layer 7 in the encapsulating sheet 1 contains the thermosetting resin, the encapsulating resin layer 7 is cured by heating so as to be formed as an encapsulating layer 10.

The curing conditions are the conditions in which the thermosetting resin in the encapsulating resin layer 7 described above is completely cured and the conditions in which an addition reaction (a hydrosilylation reaction) is progressed when the encapsulating resin composition contains a condensation/addition reaction curable type silicone resin composition.

To be specific, the heating temperature is, for example, 80 to 200° C., or preferably 100 to 180° C. and the heating duration is, for example, 0.1 to 20 hours, or preferably 1 to 10 hours.

Thereafter, the encapsulating sheet 1 and the board 14 are taken out from a vacuum compression bonding device and as shown in phantom lines in FIG. 2(d), the release sheet 5 is peeled from the encapsulating layer 10.

As described above, the LED device 2 in which the light emitting diode 11 is encapsulated by the encapsulating sheet 1 is fabricated.

When the encapsulating resin layer 7 contains the thermosetting resin, the LED device 2 which is provided with the light emitting diode 11 and the encapsulating layer 10 for encapsulating the light emitting diode 11 is fabricated.

In the LED device 2, before the release sheet 5 is peeled off, a pressure molding is performed by a flat plate pressing, so that the encapsulating sheet 1 is adhered to the light emitting diode 11 and the board 14. However, the method for fabricating the LED device 2 is not limited to this. Alternatively, for example, as shown in phantom lines in FIG. 1(b), it is also possible that after the release sheet 5 is peeled off, the pressure molding is performed by the flat plate pressing or with a metal mold die, so that the encapsulating sheet 1 is adhered to the light emitting diode 11 and the board 14.

In the encapsulating sheet 1, the encapsulating resin composition contains the silicone microparticles, so that the light transmission characteristics thereof are excellent.

Therefore, in the LED device 2 provided with the light emitting diode 11 which is encapsulated by the encapsulating sheet 1, a brightness loss in the encapsulating sheet 1 can be sufficiently suppressed.

In the encapsulating sheet 1, the encapsulating resin composition contains the silicone microparticles at a specific proportion, so that in the LED device 2, a bleeding can be prevented and a damage of the light emitting diode 11 can be also prevented because the compressive elastic modulus of the encapsulating resin layer 7 is within the above-described range.

As a result, the LED device 2 has an excellent reliability, while having an excellent extraction efficiency of the light from the light emitting diode 11.

The brightness loss is a percentage, with respect to an initial brightness (hereinafter, defined as a reference brightness) of a total luminous flux in the LED device 2 using the encapsulating sheet 1 made of an encapsulating resin composition in which silicone microparticles are not added (that is, only an encapsulating resin composition and a phosphor), of a value obtained by subtracting an initial brightness (hereinafter, defined as a brightness) of the total luminous flux in the LED device 2 using the encapsulating sheet 1 made from an encapsulating resin composition in which the silicone microparticles are added from the reference brightness.

EXAMPLES

While the present invention will be described hereinafter in further detail with reference to Prepared Examples, Examples, and Comparative Examples, the present invention is not limited to these Prepared Examples, Examples, and Comparative Examples.

Prepared Example 1

Preparation of Condensation/Addition Reaction Curable Type Silicone Resin Composition 15.76 g (0.106 mol) of a vinyltrimethoxysilane (an ethylenic silicon compound) and 2.80 g (0.0118 mol) of a (3-glycidoxypropyl)trimethoxysilane (a silicon compound containing an epoxy group) were blended into 2031 g (0.177 mol) of a polydimethylsiloxane containing silanol groups at both ends (a polysiloxane containing silanol groups at both ends, in general formula (1), all of $R^1$s are methyl, the average of "z" is 155, a number average molecular weight of 11500, a silanol group equivalent of 0.174 mmol/g), which was heated at 40° C., and the obtained mixture was stirred and mixed.

The molar ratio (the number of moles of SiOH group/the total number of moles of $SiOCH_3$ group) of the SiOH group in the polydimethylsiloxane containing silanol groups at both ends to the $SiOCH_3$ group in the vinyltrimethoxysilane and (3-glycidoxypropyl)trimethoxysilane was 1/1.

After the stirring and mixing, 0.97 mL (0.766 g, a catalyst content: 0.88 mmol, corresponding to 0.50 mol with respect to 100 mol of the polydimethylsiloxane containing silanol groups at both ends) of a methanol solution of tetramethylammonium hydroxide (a condensation catalyst, a concentration of 10 mass %) was added to the obtained mixture to be stirred at 40° C. for 1 hour. Thereafter, the obtained mixture was stirred under a reduced pressure (10 mmHg) at 40° C. for 1 hour and a volatile component (methanol or the like) was removed.

Thereafter, the pressure in the system was brought back to the normal pressure and then, 44.5 g (0.022 mol) of an organohydrogensiloxane (manufactured by Shin-Etsu Chemical Co., Ltd., a dimethylpolysiloxane-co-methylhydrogenpolysiloxane, an average molecular weight of 2000, a hydrosilyl group equivalent of 7.14 mmol/g) was added to the reactant to be stirred at 40° C. for 1 hour.

The molar ratio ($CH_2$=CH—/SiH) of the vinyl group ($CH_2$=CH—) in the vinyltrimethoxysilane to the hydrosilyl group (SiH group) in the organohydrogensiloxane was 1/3.

Thereafter, 0.13 g (0.13 mL, a platinum content of 2 mass %, as a platinum, corresponding to $5.8 \times 10^{-3}$ parts by mass with respect to 100 parts by mass of the organohydrogensiloxane) of a siloxane solution of a platinum carbonyl complex (an addition catalyst, a platinum concentration of 2 mass %) was added to the system to be stirred at 40° C. for 10 minutes, so that a silicone resin composition (a condensation/addition reaction curable type) was obtained.

Example 1

Preparation of Encapsulating Resin Composition 8 g of YAG:Ce (a phosphor, an average particle size of 8.9 μm) and 20 g of Tospearl 2000B (trade name, polymethylsilsesquioxane microparticles, an average particle size of 6.0 μm, manufactured by Momentive Performance Materials Inc.) were added to 72 g of the above-described silicone resin composition to be stirred at room temperature (at 20° C.) for 1 hour. After the stirring, the obtained mixture was subjected to a defoaming process under a reduced pressure with a vacuum dryer at room temperature for 30 minutes or more.

In this way, an encapsulating resin composition was prepared.

<Fabrication of Encapsulating Sheet>

The encapsulating resin composition was applied to the upper surface of a release sheet (ref: FIG. 1(a)) made of a polyester film (trade name: SS4C, manufactured by Nippa CO., LTD., a thickness of 50 μm) with a thickness of 600 μm to be heated at 135° C. for 3 minutes, so that an encapsulating sheet in which an encapsulating resin layer having a thickness of 600 μm was laminated on the upper surface of the release sheet was fabricated.

<Fabrication of LED Device>

A light emitting diode (EZ900, 0.88 mm×0.88 mm, a thickness of 170 μm) was mounted on an aluminum core board by a wire bonding.

A wire was made of gold and the wire diameter thereof was 30 μm. The wire was formed into a curved shape. The size thereof was as follows: a length in the up-down direction between the light emitting diode-side contact point and the most upper portion of the wire of 180 μm; a length in the up-down direction between the aluminum core board-side contact point and the most upper portion of the wire of 350 μm; and a length in the right-left direction between the light emitting diode-side contact point and the aluminum core board-side contact point of 900 μm.

Thereafter, the encapsulating sheet was cut into a rectangular shape in plane view having a size of 10 mm×10 mm.

Next, the encapsulating sheet in a state shown in FIG. 1(b) was reversed up-side down and the reversed encapsulating sheet was disposed so that the encapsulating resin layer was opposed to the light emitting diode at spaced intervals thereto in the up-down direction.

Next, the light emitting diode was embedded by the encapsulating sheet at normal temperature (at 25° C.) (ref: FIGS. 2(b) and 2(c)).

To be specific, the encapsulating sheet was lowered and the surfaces of the light emitting diode and the wire were covered with the encapsulating resin layer (ref: FIG. 2(b)). Subsequently, the position of the encapsulating sheet was retained for 40 seconds in a state where the thickness of the encapsulating resin layer was controlled so as to be compressed by the pushed-in amount of 50 μm (pushed-in rate of 10%=pushed-in amount of 50 μm/thickness of the encapsulating resin layer before the compression (the compressive bonding) of 600 μm×100%), so that the encapsulating sheet was compressively bonded to the aluminum core board (ref: FIG. 2(c)).

After the compressive bonding, the thickness of the encapsulating resin layer was 550 μm.

Thereafter, the temperature was increased from 25° C. to 150° C. at a rate of 2° C./min and the encapsulating sheet was heated at 150° C. for 5 hours (ref: FIG. 2(d)). In this way, the encapsulating resin layer was cured, so that the encapsulating sheet including the encapsulating layer was fabricated.

Thereafter, the release sheet was peeled from the encapsulating layer, so that an LED device was fabricated.

Examples 2 to 7 and Comparative Examples 1 to 5

An encapsulating resin composition was prepared and subsequently, an encapsulating sheet and an LED device were fabricated in the same manner as in Example 1, except that the mixing formulation was changed in conformity with Table 1.

<Evaluation>

The following tests of the encapsulating resin compositions, the encapsulating sheets, and the LED devices in Examples and Comparative Examples were conducted.

(1) Viscosity Test

The viscosity of the encapsulating resin composition was measured at 25° C. with an E-type viscometer (model number: TVE-22H, manufactured by TOKI SANGYO CO., LTD.).

The results are shown in Table 1.

(2) Compressive Elastic Modulus Test

The compressive elastic modulus of the encapsulating resin layer was measured at 25° C. with a precision load measuring device (model number: 1605 II VL, manufactured by AIKOH ENGINEERING CO., LTD.).

The results are shown in Table 1.

(3) Haze Value Test

An encapsulating resin composition was prepared in the same manner as described above, except that YAG:Ce was not added in the preparation of the encapsulating resin composition. An encapsulating sheet in which the encapsulating resin layer having a thickness of 500 μm was laminated on the upper surface of the release sheet was fabricated in the same manner as described above, except that the encapsulating resin composition was applied to the upper surface of the release sheet so as to have a thickness of 500 μm in the fabrication of the encapsulating sheet.

The haze value of the encapsulating resin layer obtained by peeling the release sheet from the encapsulating resin layer in the encapsulating sheet with respect to the visible light was measured with a haze meter (model number: HM150, manufactured by MURAKAMI COLOR RESEARCH LABORATORY CO., Ltd.).

The results are shown in Table 1.

(4) Light Transmittance Test

An encapsulating resin composition was prepared in the same manner as described above, except that YAG:Ce was not added in the preparation of the encapsulating resin composition. An encapsulating sheet in which the encapsulating resin layer having a thickness of 500 μm was laminated on the upper surface of the release sheet was fabricated in the same manner as described above, except that the encapsulating resin composition was applied to the upper surface of the release sheet so as to have a thickness of 500 μm in the fabrication of the encapsulating sheet.

The light transmittance of the encapsulating resin composition and the encapsulating resin layer obtained by peeling the release sheet from the encapsulating resin layer in the encapsulating sheet with respect to the light in the wavelength of 460 nm were measured with a spectrophotometer (model number: V670, manufactured by JASCO Corporation).

The results are shown in Table 1.

(5) Precipitation Test (Bleeding Test) of Liquid Resin

The LED device was put in a constant temperature and humidity chamber set to be at 85° C. and a relative humidity (RH) of 85% and an electric current of 250 mA was applied through the light emitting diode, so that the light emitting diode was allowed to continuously light up.

The evaluation was conducted as follows: when a bleeding of the liquid resin was not confirmed on the surface of the LED device 24 hours after the start of the continuous lighting up visually and with an optical microscope, the LED device was evaluated as "Good" and when a bleeding of the liquid resin was confirmed thereon, the LED device was evaluated as "Bad".

The results are shown in Table 1.

(6) Shape Change Test

The LED device was put in a constant temperature and humidity chamber set to be at 85° C. and a relative humidity (RH) of 85% and an electric current of 250 mA was applied through the light emitting diode, so that the light emitting diode was allowed to continuously light up.

The evaluation was conducted as follows: when the change of the shape was not confirmed on the surface of the LED device 24 hours after the start of the continuous lighting up visually, the LED device was evaluated as "Good" and when the change of the shape was confirmed thereon, the LED device was evaluated as "Bad".

The results are shown in Table 1.

(7) Brightness Test

The initial brightness of the total luminous flux in the LED device was measured by applying an electric current of 250 mA through the light emitting diode with a brightness measurement device (MCPD 9800, manufactured by OTSUKA ELECTRONICS CO., LTD.) and an integrating sphere (Half-Moon, manufactured by OTSUKA ELECTRONICS CO., LTD.).

A brightness loss (%) of each of the LED devices in Examples and Comparative Examples (excluding Example 1) was calculated by defining a brightness of the LED device in Comparative Example 1 as a reference brightness (0% of the brightness loss).

The results are shown in Table 1.

TABLE 1

| | Examples Comparative Examples | | Ex. 1 | Ex. 2 | Ex. 3 | Ex. 4 | Ex. 5 | Ex. 6 | Ex. 7 |
|---|---|---|---|---|---|---|---|---|---|
| Mixing Formulation | Encapsulating Resin | *1 Silicone Resin Composition | 72 | 62 | 42 | 62 | 62 | 62 | 62 |
| | Silicone Microparticles | Tospearl 2000B *2 (6.0 μm) | 20 | 30 | 50 | — | — | — | — |
| | | Tospearl 145 *2 (4.5 μm) | — | — | — | 30 | — | — | — |
| | | Silicone Powder KMP 590 *2 (2.0 μm) | — | — | — | — | 30 | — | — |
| | | Silicone Powder MSPN 050 *2 (0.5 μm) | — | — | — | — | — | 30 | — |
| | | Silicone Powder MSPN 080 *2 (0.8 μm) | — | — | — | — | — | — | 30 |
| | Silicon Dioxide | FB-3sdc *2 (3.4 μm) | — | — | — | — | — | — | — |
| | | AEROSIL R976S *2 (7 nm) | — | — | — | — | — | — | — |
| | Phosphor | YAG:Ce | 8 | 8 | 8 | 8 | 8 | 8 | 8 |
| Evaluation | Encapsulating Resin Composition | Viscosity [Pa·s] (25° C.) | 32 | 44 | 167 | 45 | 48 | 47 | 48 |
| | Encapsulating Resin Layer | Compressive Elastic Modulus [MPa] | 0.04 | 0.04 | 0.04 | 0.04 | 0.04 | 0.04 | 0.04 |
| | | Haze Value | 10 | 10 | 10 | 10 | 10 | 10 | 10 |
| | | Light Transmittance [%] | 92.7 | 92.7 | 92.6 | 92.7 | 92.4 | 92.5 | 92.4 |
| | LED Device | Presence or Absence of Bleeding | Good | Good | Good | Good | Good | Good | Good |
| | | Presence or Absence of Shape Change | Good | Good | Good | Good | Good | Good | Good |
| | | Brightness Loss [%] | 0 | 0 | 0 | 0 | 0 | 0 | 0 |

TABLE 1-continued

| Examples Comparative Examples | | | Comp. Ex. 1 | Comp. Ex. 2 | Comp. Ex. 3 | Comp. Ex. 4 | Comp. Ex. 5 |
|---|---|---|---|---|---|---|---|
| Mixing Formulation | Encapsulating Resin | *1 Silicone Resin Composition | 92 | 82 | 32 | 79.5 | 59.5 |
| | Silicone Microparticles | Tospearl 2000B *2 (6.0 μm) | — | 10 | 60 | — | — |
| | | Tospearl 145 *2 (4.5 μm) | — | — | — | — | — |
| | | Silicone Powder KMP 590 *2 (2.0 μm) | — | — | — | — | — |
| | | Silicone Powder MSPN 050 *2 (0.5 μm) | — | — | — | — | — |
| | | Silicone Powder MSPN 080 *2 (0.8 μm) | — | — | — | — | — |
| | Silicon Dioxide | FB-3sdc *2 (3.4 μm) | — | — | — | 10 | 30 |
| | | AEROSIL R976S *2 (7 nm) | — | — | — | 2.5 | 2.5 |
| | Phosphor | YAG:Ce | 8 | 8 | 8 | 8 | 8 |
| Evaluation | Encapsulating Resin Composition | Viscosity [Pa · s] (25° C.) | 24 | 28 | >200 | 36 | 98 |
| | Encapsulating Resin Layer | Compressive Elastic Modulus [MPa] | 0.04 | 0.04 | 0.04 | 0.04 | 0.04 |
| | | Haze Value | 10 | 10 | 10 | 89 | 90 |
| | | Light Transmittance [%] | 93.2 | 92.7 | 92.5 | 91.3 | 78 |
| | LED Device | Presence or Absence of Bleeding | Bad | Bad | Good | Good | Good |
| | | Presence or Absence of Shape Change | Bad | Bad | Good | Good | Good |
| | | Brightness Loss [%] | 0 | 0 | 0 | 2 | 6 |

*1 Light Transmittance of Silicone Resin Composition: 93.2%
*2 Average Particle Size The details of each of the components in Table 1 are given below.

Tospearl 2000B: trade name, polymethylsilsesquioxane microparticles, an average particle size of 6.0 μm, manufactured by Momentive Performance Materials Inc.

Tospearl 145: trade name, polymethylsilsesquioxane microparticles, an average particle size of 4.5 μm, manufactured by Momentive Performance Materials Inc.

Silicone Powder KMP 590: trade name, polymethylsilsesquioxane microparticles, an average particle size of 2.0 μm, manufactured by Shin-Etsu Chemical Co., Ltd.

Silicone Powder MSP-N050: trade name, polymethylsilsesquioxane microparticles, an average particle size of 0.5 μm, manufactured by NIKKO RICA CORPORATION Silicone Powder MSP-N080: trade name, polymethylsilsesquioxane microparticles, an average particle size of 0.8 μm, manufactured by NIKKO RICA CORPORATION FB-3sdc: trade name, silicon dioxide, manufactured by DENKI KAGAKU KOGYO KABUSHIKI KAISHA, an average particle size of 3.4 μm AEROSIL R976S: trade name, silicon dioxide, an average particle size of 7 nm, manufactured by Nippon Aerosil Co., Ltd.

YAG:Ce: a phosphor, an average particle size of 8.9 μm

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. An encapsulating sheet comprising:
a release sheet formed from a resin film, and
an encapsulating resin layer formed on the release sheet and formed from an encapsulating resin composition, wherein the encapsulating resin composition contains an encapsulating resin including an encapsulating silicone resin composition, and silicone microparticles,
the mixing ratio of the silicone microparticles with respect to the encapsulating resin composition is 20 to 50 mass %,
the silicone microparticles are microparticles of polysiloxanes having a cross-linked structure, and
the encapsulating resin is a transparent resin and is used to encapsulate an optical semiconductor element.

2. The encapsulating sheet according to claim 1, wherein the encapsulating resin composition further contains a phosphor.

3. An optical semiconductor element device comprising:
an optical semiconductor element and
an encapsulating layer which is formed from an encapsulating sheet and encapsulates the optical semiconductor element, and
the encapsulating sheet comprising:
an encapsulating resin composition which contains an encapsulating resin including an encapsulating silicone resin composition, and silicone microparticles, wherein
the mixing ratio of the silicone microparticles with respect to the encapsulating resin composition is 20 to 50 mass %, and
the silicone microparticles are microparticles of polysiloxanes having a cross-linked structure, the encapsulating resin is a transparent resin,
the refractive index of the silicone microparticles is 1.39 to 1.43, and
a difference between the refractive index of the silicone microparticles and the refractive index of the encapsulating resin is within 0.03 in absolute value.

4. The encapsulating sheet according to claim 1, wherein the average particle size of each of the silicone microparticles is 0.2 to 40 μm.

5. The optical semiconductor element device according to claim 3, wherein the average particle size of each of the silicone microparticles is 0.2 to 40 μm.

6. The encapsulating sheet according to claim 1, wherein the silicone microparticles are polysilsesquioxane microparticles.

7. The encapsulating sheet according to claim 1, comprising an encapsulating resin layer formed from the encapsulating resin composition, the encapsulating resin layer being in a semi-cured state.

8. The encapsulating sheet according to claim 1, comprising an encapsulating resin layer formed from the encapsulating resin composition, wherein the encapsulating resin layer is in a semi-cured state and has a compressive elastic modulus (at 25° C.) of 0.04 to 0.1 MPa.

* * * * *